United States Patent
Xu et al.

(10) Patent No.: US 12,254,398 B2
(45) Date of Patent: Mar. 18, 2025

(54) SPARSE MACHINE LEARNING ACCELERATION

(71) Applicant: Amazon Technologies, Inc., Seattle, WA (US)

(72) Inventors: Kun Xu, Austin, TX (US); Ron Diamant, Santa Clara, CA (US); Patricio Kaplan, Palo Alto, CA (US)

(73) Assignee: Amazon Technologies, Inc., Seattle, WA (US)

( * ) Notice: Subject to any disclaimer, the term of this patent is extended or adjusted under 35 U.S.C. 154(b) by 1024 days.

(21) Appl. No.: 17/301,271

(22) Filed: Mar. 30, 2021

(65) Prior Publication Data
US 2022/0318604 A1 Oct. 6, 2022

(51) Int. Cl.
*G06N 3/06* (2006.01)
*G06N 3/04* (2023.01)
*G06N 3/063* (2023.01)
*G06N 3/08* (2023.01)

(52) U.S. Cl.
CPC ............ *G06N 3/063* (2013.01); *G06N 3/04* (2013.01); *G06N 3/08* (2013.01)

(58) Field of Classification Search
CPC .......... G06N 3/063; G06N 3/04; G06N 3/08; G06N 3/082; H03M 7/6005; H03M 7/3059
See application file for complete search history.

(56) References Cited

U.S. PATENT DOCUMENTS

| | | | |
|---|---|---|---|
| 11,003,985 B2 | 5/2021 | Kim et al. | |
| 11,126,690 B2 | 9/2021 | Azizi | |
| 11,194,549 B2 | 12/2021 | Liu et al. | |
| 11,379,556 B2 | 7/2022 | Mattina et al. | |
| 11,500,962 B1 | 11/2022 | Meyer et al. | |
| 11,625,453 B1 | 4/2023 | Meyer et al. | |
| 11,709,783 B1 * | 7/2023 | Chen .................... | G06F 13/28 710/26 |
| 11,803,736 B1 | 10/2023 | Meyer et al. | |

(Continued)

OTHER PUBLICATIONS

Brownlee, Jason, "A Gentle Introduction to Sparse Matrices for Machine Learning", Machine Learning Mastery, Mar. 14, 2018, https://machinelearningmastery.com/sparse-matrices-for-machine-learning/ [retrieved on Mar. 30, 2021].

(Continued)

*Primary Examiner* — Dave Misir
(74) *Attorney, Agent, or Firm* — Weaver Austin Villeneuve & Sampson LLP

(57) ABSTRACT

To reduce the storage size of weight tensors and speed up loading of weight tensors from system memory, a compression technique can be employed to remove zero values from a weight tensor before storing the weight tensor in system memory. A sparsity threshold can be enforced to achieve a compression ratio target by forcing small weight values to zero during training. When the weight tensor is loaded from system memory, a direct memory access (DMA) engine with an in-line decompression unit can decompress the weight tensor on-the-fly. By performing the decompression in the DMA engine, expansion of the weight values back to the original weight tensor size can be carried out in parallel while other neural network computations are being performed by the processing unit.

19 Claims, 11 Drawing Sheets

(56) References Cited

U.S. PATENT DOCUMENTS

| | | | |
|---|---|---|---|
| 2018/0349290 A1* | 12/2018 | Staudenmaier | G06F 13/28 |
| 2019/0362235 A1 | 11/2019 | Xu et al. | |
| 2019/0392300 A1* | 12/2019 | Weber | G06N 3/04 |
| 2020/0097834 A1* | 3/2020 | Liu | G06N 3/0495 |
| 2020/0143249 A1* | 5/2020 | Georgiadis | G06N 3/045 |
| 2020/0228137 A1* | 7/2020 | Chinya | H03M 7/3059 |
| 2021/0042617 A1* | 2/2021 | Chinya | G06N 3/082 |
| 2021/0159912 A1* | 5/2021 | Wang | H04N 19/124 |
| 2021/0295168 A1 | 9/2021 | Xu et al. | |
| 2023/0100930 A1 | 3/2023 | Tan et al. | |

OTHER PUBLICATIONS

U.S. Appl. No. 16/827,444, filed Mar. 23, 2020, Xu et al.

International Search Report and Written Opinion dated Jul. 7, 2022 in Application No. PCT/US2022/071421.

Liu, Z. et al., "Sparse Systolic Tensor Array for Efficient CNN Hardware Acceleration," arXiv.org, Cornell University Library, 201 Olin Library Cornell University Ithaca, NY 14853, Oct. 12, 2020, pp. 1-13.

Blalock, D., et al. "What Is the State of Neural Network Pruning?" Proc. of the 3rd Machine Learning and Systems (MLSys) Conference, 2020, pp. 1-18, URL: https://proceedings.mlsys.org/paper/2020/file/d2ddea18f00665ce8623e36bd4e3c7c5-Paper.pdf.

Busato, F., et al. "Exploiting NVIDIA Ampere Structured Sparsity with cuSPARSELt," NVIDIA Technical Blog, Dec. 8, 2020, pp. 1-8, URL: https://developer.nvidia.com/blog/exploiting-ampere-structured-sparsity-with-cusparselt/.

EP Rule 161 Communication dated Nov. 8, 2023 in EP Application No. 22716843.2.

Li, Z., et al., "The Lazy Neuron Phenomenon: On Emergence of Activation Sparsity in Transformers," arXiv:2210.06313v2 [cs.LG], Jun. 2023, pp. 1-35, URL: https://arxiv.org/abs/2210.06313v2.

Pool, J., "Accelerating Sparsity in the NVIDIA Ampere Architecture," NVIDIA GTC 2020: GPU Technology Conference, S22085, Mar. 2020, 71 pages.

Pool, J., et al., "Accelerating Inference with Sparsity Using the NVIDIA Ampere Architecture and NVIDIA TensorRT," NVIDIA Technical Blog, Jul. 20, 2021, 5 pages, URL: https://developer.nvidia.com/blog/accelerating-inference-with-sparsity-using-ampere-and-tensorrt/.

See, A., et al., "Compression of Neural Machine Translation Models via Pruning," Proc. of the 20th SIGNLL Conference on Computational Natural Language Learning (CoNLL), 2016, pp. 291-301.

U.S. Appl. No. 18/052,527, inventors Meyer P G, et al., filed Nov. 3, 2022.

U.S. Appl. No. 18/194,055, inventors Tan X, et al., filed on Mar. 31, 2023.

U.S. Appl. No. 18/194,072, inventors Tan X, et al., filed on Mar. 31, 2023.

U.S. Appl. No. 18/435,566, inventors Romaszkan W, et al., filed on Feb. 7, 2024.

U.S. Appl. No. 18/435,571, inventors Romaszkan W, et al., filed on Feb. 7, 2024.

U.S. Appl. No. 18/474,129, inventors Meyer P G, et al., filed on Sep. 25, 2023.

U.S. Appl. No. 18/509,272, inventors Meyer P G, et al., filed on Nov. 14, 2023.

U.S. Appl. No. 18/509,274, inventors Meyer P G, et al., filed on Nov. 14, 2023.

U.S. Appl. No. 18/509,275, inventors Meyer P G, et al., filed on Nov. 14, 2023.

U.S. Appl. No. 18/509,278, inventors Meyer P G, et al., filed on Nov. 14, 2023.

U.S. Appl. No. 18/509,282, inventors Meyer P G, et al., filed on Nov. 14, 2023.

U.S. Appl. No. 18/511,722, inventors Meyer P G, et al., filed on Nov. 16, 2023.

U.S. Appl. No. 18/882,694, inventors Meyer P G, et al., filed on Sep. 11, 2024.

Wang, M., et al., "Balancing memory-accessing and computing over sparse DNN accelerator via efficient data packaging," Journal of Systems Architecture, vol. 117, 2021, 102094, 11 pages. DOI: 10.1016/J.SYSARC.2021.102094.

Zhang, Z., et al., "MoEfication: Transformer Feed-forward Layers are Mixtures of Experts," Findings of the Association for Computational Linguistics: ACL 2022, May 2022, pp. 877-890.

* cited by examiner

FIG. 4

SPARSE MACHINE LEARNING ACCELERATION

BACKGROUND

Neural networks can be trained using machine learning techniques to perform a certain computing task for an application. The trained neural network can then perform the computing task, for example, to generate an inference from input data. Computing tasks that neural networks can perform may include human-like functions such as visual and audial perception, natural language processing, etc.

BRIEF DESCRIPTION OF THE DRAWINGS

Various embodiments in accordance with the present disclosure will be described with reference to the drawings, in which:

FIG. 4 illustrates an example of a two-dimensional weight tensor.

DETAILED DESCRIPTION

Weight models used in machine learning, and in particular for deep learning, can be large. For example, some weight tensors can take up 32 GB of storage space. When the neural network model size is greater than the external memory capacity of a computing device, the model cannot fit in a single device. One way to work around the storage limitation is to divide the weight model into multiple sections and perform the neural network computations in multiple devices. However, such solutions require additional level of software complexity to manage the distributed computations. Such solutions also result in longer latency and lower throughput due to the communications between devices. Even if a model can fit within the external memory of a single computing device, loading a large model from the external memory into the processing unit can take up significant memory bandwidth, which also causes lower throughput.

Although weight tensors used in machine learning can be large, most weight tensors are also sparse, since many of the weight values are zero. To reduce the storage size of weight tensors and speed up loading of weight tensors from system memory, a compression technique can be employed to remove zero values from a weight tensor before storing the weight tensor in system memory. A sparsity threshold can be enforced to achieve a compression ratio target by forcing small weight values to zero during training. To further reduce the size of a weight tensor, weight values can also be quantized to change the weight values from a high precision datatype to a lower precision datatype to reduce the bit-length of the weight values. When the weight tensor is loaded from system memory, a direct memory access (DMA) engine with an in-line decompression unit can decompress the weight tensor on-the-fly. By performing the decompression in the DMA engine, expansion of the weight values back to the original weight tensor size can be carried out in parallel while other neural network computations are being performed by the processing unit.

In the following description, various examples will be described. For purposes of explanation, specific configurations and details are set forth in order to provide a thorough understanding of the examples. However, it will also be apparent to one skilled in the art that the example may be practiced without the specific details. Furthermore, well-known features may be omitted or simplified in order not to obscure the embodiments being described.

Figure 1:
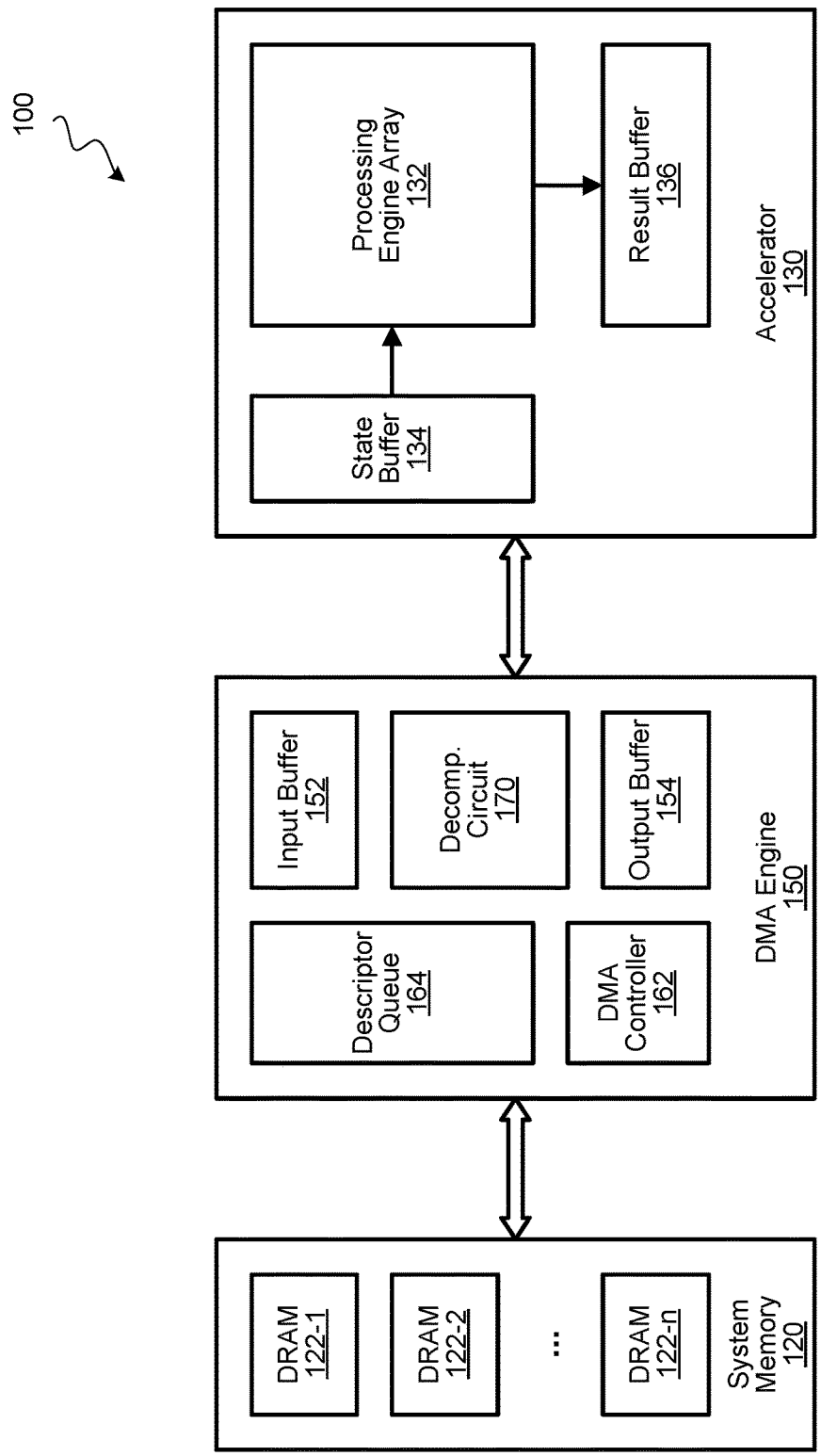
FIG. 1 illustrates an example of a computing system.

FIG. 1 illustrates an example of a computing system 100. Computing system 100 includes a DMA engine 150, a system memory 120, and an accelerator 130. Computing system 100 may include other components not specifically shown, such as a host processor. Accelerator 130 can be a neural network accelerator (e.g., a neural network processor, tensor processing unit, etc.), and may include a processing engine array 132 (e.g., a systolic array), a state buffer 134, and a result buffer 136. Processing engine array 132 may include an array of processing engines arranged in rows and columns. Each processing engine is capable of performing a multiply-and-add operation. State buffer 134 is used to store input data such as feature map values and weight values for processing engine array 132. During operation, the input data are shifted into processing engine array 132 from state buffer 134 along the rows of the array. The computation results of the processing engines are accumulated along the column direction, and the column output data are stored in result buffer 136.

In most instances, tensors processed by processing engine array 132 may have thousands or even millions of elements. Because not all elements of a tensor can fit within accelerator 130 at the same time, system memory 120 can be used to store data that are not currently being processed in accelerator 130. As computations are carried out, data needed by accelerator 130 can be transferred from system memory 120 into accelerator 130, and data no longer needed by accelerator 130 can be transferred from accelerator 130 to system memory 120. System memory 120 can be implemented using one or more dynamic random access memory (DRAM) devices 122-1 to 122-$n$ and/or other types of memories. In other implementations, system memory can be implemented, for example, with static random access memory (SRAM), flash memory, 3D cross-point memory, or any combination thereof.

Data transfers between system memory 120 and other components of computing system 100 may involve a host processor (not shown) to issue read and write commands to system memory 120. Such memory accesses through a host processor may incur unnecessary latency, especially when the host processor is not a consumer or generator of the data being accessed. To bypass the host processor, DMA engine 150 can be used to directly exchange data between system memory 120 and accelerator 130.

DMA engine 150 may include a DMA controller 162, a descriptor queue 164, an input data buffer 152, and an output data buffer 154. Furthermore, DMA engine 150 may include a decompression circuit block 170 that can be used to perform on-the-fly decompression of weight tensors for accelerator 130. Descriptor queue 164 can be implemented as a circular buffer or ring queue, and is configured to store a set of memory descriptors that is used by DMA engine 150 to exchange data between system memory 120 and other components of computing system 100. For example, when accelerator 130 has data to store in system memory 120 or is requesting data from system memory 120, a memory descriptor providing a source address and a destination address can be placed in descriptor queue 164 to initiate the transfer. In some implementations, DMA engine may include multiple descriptor queues. For example, DMA engine 110 may include a descriptor queue for writing data into system memory 120, and a descriptor queue for reading data from system memory 120. In some implementations, DMA engine 110 may implement multiple data transmission channels (e.g., different channels for different components of computing system 100), and each transmission channel may have its own descriptor queue or pair of descriptor queues for each transfer direction.

DMA controller 162 can be used to manage the operations of DMA engine 150. For example, DMA controller 162 can maintain head and tail pointers for descriptor queue 164 of DMA engine 150. DMA controller 162 can monitor the number of available entries in descriptor queue 164 to prevent queue overflow. In some implementations, DMA controller 162 can also maintain completion statuses and generates interrupts for component of computing system 100. DMA controller 162 may process the memory descriptors in descriptor queue 164 by obtaining data from the designated source in the memory descriptor, and placing that data in input buffer 152 in preparation for transfer to the target destination. Input buffer 152 can be used to temporarily hold data associated with a memory descriptor that is ready for processing, while waiting for the processing of a previous memory descriptor to complete. Output buffer 154 can be used to temporarily hold data that is ready to be written out to a target location. In some implementations, the data read via input buffer 152 can be modified by the DMA engine 150 before being placed into the target location, and output buffer 154 can be used to store the modified data before the data is written out.

Decompression circuit block 170 can perform in-line expansion of a compressed weight tensor back to its original weigh tensor size. For example, when a memory descriptor in descriptor queue 164 indicates that a weight tensor is to be read from system memory 120 and placed into state buffer 134 of accelerator 130, a compression indicator in the memory descriptor (or information stored together with the weight tensor) may indicate that the weight tensor has been compressed. Input buffer 152 can read the compressed weight tensor from system memory and provide the compressed weight tensor to decompression circuit block 170. Decompression circuit block 170 can expand the compressed weight tensor by inserting additional bytes in the weight tensor before copying the weight tensor into output buffer 154 for placement into the state buffer 134 of accelerator 130. By performing the decompression in DMA engine 150 instead of accelerator 130, accelerator 130 can continue to perform computations in parallel while waiting for the new weight tensor. This can increase the overall throughput of computing system 100 and reduce the latency when switching weight tensors.

Figure 2:
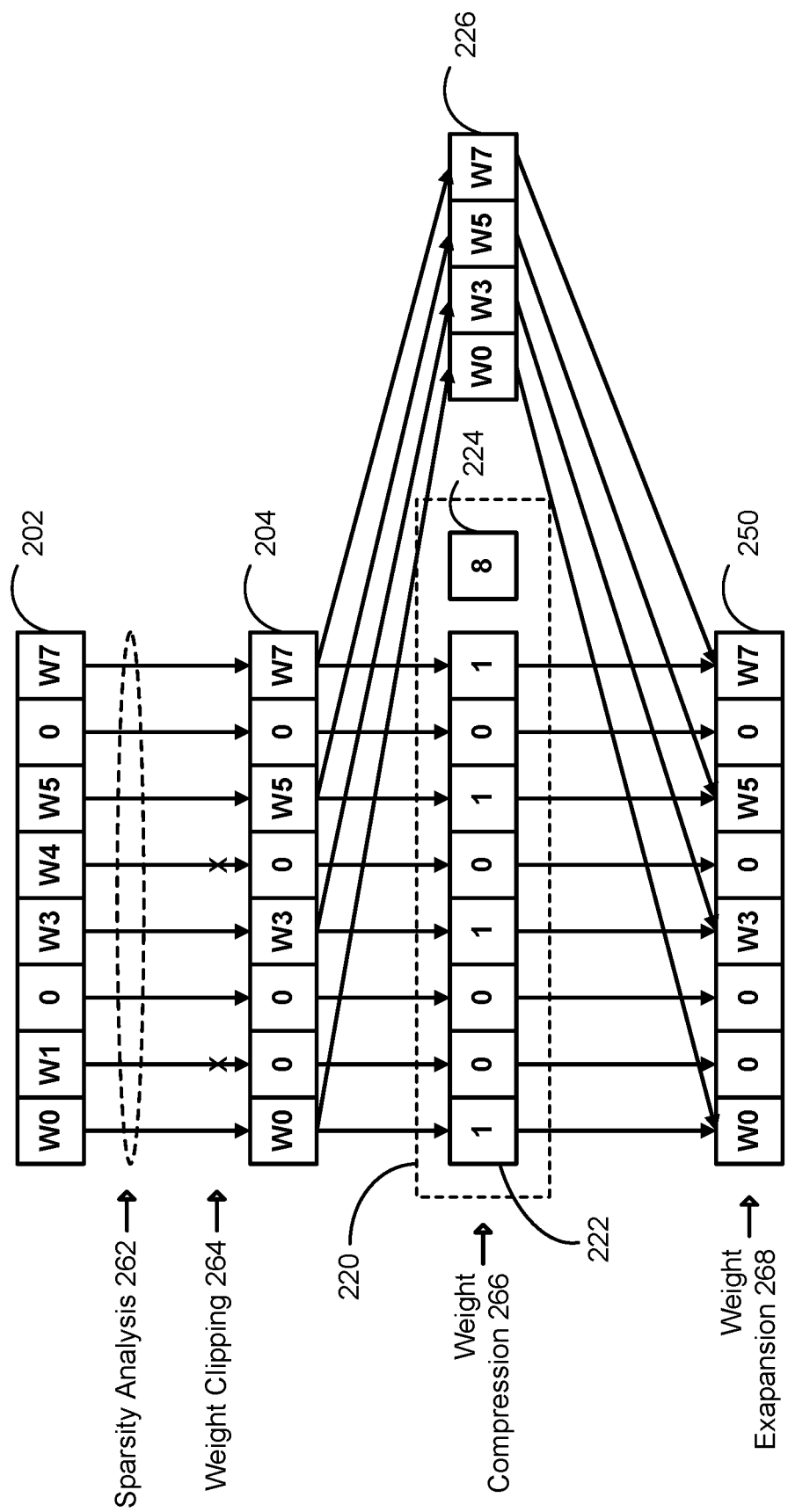
FIG. 2 illustrates a conceptual diagram of an example of a compression technique.

FIG. 2 illustrates a conceptual diagram of an example of a technique for weight tensor compression. For ease of explanation, an initial weight tensor 202 shown in FIG. 2 includes eight weight values and is shown as a row of weight values. However, it should be understood that a weight tensor can include any number of weight values (e.g., thousands of weight values), and that the weight tensor can be represented in a matrix form having both rows and columns.

Initial weight tensor 202 can be a weight tensor generated from a training operation. In some implementations, initial weight tensor 202 can be the resulting weight tensor after a training process for a neural network mode is complete, and initial weight tensor 202 can be used for an inference operation. In some implementations, initial weight tensor 202 can be the resulting weight tensor after one or more training iterations in the middle of a training process, and initial weight tensor 202 can be used as input for the next training iteration. In the example shown, initial weight tensor 202 includes six non-zero values W0, W1, W3, W4, W5, and W7, and two zero values. As mentioned above, it is not uncommon to have sparse weight tensors. As such, a training operation can yield one or more weights having a zero value as shown.

In some implementations, a sparsity analysis 262 can be performed on initial weight tensor 202. Sparsity analysis 262 may assess the sparsity of initial weight tensor 202, and determine whether initial weight tensor 202 meets certain sparsity criteria. For instance, the sparsity of initial weight tensor 202 can be calculated as the ratio of weights having a zero value to the total number of weights, and a determination can be made as to whether initial weight tensor 202 meets a target sparsity threshold. In the example shown in FIG. 2, initial weight tensor 202 has a sparsity of 25%. If a target sparsity threshold is set at 50%, then initial weight tensor 202 does not meet the sparsity criteria, and clipping of the weight values in initial weight tensor 202 can be performed to achieve the sparsity criteria. As another example, the sparsity criteria can be expressed in terms of a maximum number of non-zero weight values regardless of the total number of weights (e.g., to ensure the weight matrix is within a storage limit), and the number of non-zero weight values in initial weight tensor 202 can be counted to determine if the sparsity criteria is met. The sparsity criteria can also be expressed in other statistic metrics such as having a certain number of standard deviations of weight values be zero. Factors that can be considered when setting the sparsity criteria may include storage capacity of the computing system, size of weight tensor, accuracy requirement of the neural network model, etc. In some implementations, the sparsity criteria can also be adjusted based on the stage of the training process. For example, the sparsity criteria can be less sparse (fewer number of zeros weight values) at the beginning of training, and as training progresses, the sparsity criteria can increase (greater number of zero weight values).

If sparsity analysis 262 determines that initial weight tensor 202 does not meet the sparsity criteria, a weight clipping operation 264 can be performed to force some of the non-zero weight values in initial weight tensor 202 to zero to generate a modified weight tensor 204. Weight clipping operation 264 may force non-zero weight values having a magnitude being below a threshold value to zero. The threshold value can be a predetermined value, or the threshold value can be adjusted such that the modified weight tensor 204 can satisfy the sparsity criteria. In some implementations, weight clipping operation 264 may force a number of the lowest non-zero weight values to zero. Similarly, the number of weight values to force can be a predetermined number, or the number of weight values to force can be adjusted such that the modified weight tensor 204 can satisfy the sparsity criteria. In the example shown in FIG. 2, the weight clipping operation 264 forces the two lowest weight values W1 and W4 in magnitude to zero to satisfy the sparsity criteria of have a 50% sparsity.

In some implementations, sparsity analysis 262 and/or weight clipping operation 264 can be omitted. For example, an initial weight tensor can be subjected to weight clipping operation 264 regardless of the initial sparsity of the tensor such that sparsity analysis 262 can be omitted. In some instances, sparsity analysis 262 can be performed without any weight clipping such as the case when the initial weight tensor satisfies the sparsity criteria. Furthermore, in some implementations, both sparsity analyses 262 and weight clipping operation 264 can be omitted, and initial weight tensor 202 can be compressed as is.

Weight compression 266 can be performed to reduce the storage size of initial weight tensor 202 by removing any zero values from modified weight tensor 204 (or initial weight tensor 202). In the example shown in FIG. 2, the compressed weight tensor 226 includes only the non-zero weight values of modified weight tensor 204 (e.g., W0, W3, W5, and W7). To allow compressed weight tensor 226 to be expanded when used for computations, a compression header 220 is generated to provide information on the locations of zero values (or non-zero values) and the size of the decompressed weight tensor. For example, compression header 220 may include a bit map 222 to provide index information indicating locations of the zero weight values (or non-zero weight values) in the decompressed weight tensor. Bit map 222 can be a binary bit map containing a number of bits being equal to the number of elements or weight values in the weight tensor. In the example shown in FIG. 2, the weight tensor has eight elements, and thus bit map 222 contains eight bits, in which each bit represents one element or one weight value. A value of '1' in bit map 222 indicates that the corresponding element in the weight tensor is a non-zero value, and a value of '0' in bit map 222 indicates that the corresponding element in the weight tensor has a zero value. In some implementations, the bit map value indicating whether a weight value is zero or non-zero can be reversed. In some implementations, other values can be used to represent the presence of non-zero versus zero values.

Compression header 220 may also include a length value 228 indicating the size or the number of weight values in the weight tensor. In the example shown in FIG. 2, the weight tensor has eight elements, and thus the length value 224 is eight. Compression header 220 can be stored together with compressed weight tensor 226 (e.g., in system memory) such that a component (e.g., a DMA engine) reading the compressed weight tensor 226 can access compression header 220 to obtain information on how to expand or decompress the compressed weight tensor 226.

To regenerate the weight tensor (e.g., for loading into a systolic array, and/or for use in subsequent training or inference operations), weight expansion operation 268 can be performed on compressed weight tensor 266 to re-insert zero values in the proper locations in the weight tensor. For example, bit map 222 containing the index information indicating locations of the zero weight values can be read, and the non-zero weight values can be placed, in the order as the weight values appear in compressed weight tensor 226, into the decompressed weight tensor 250 at the corresponding indexes of the '1' values in bit map 222. Thus, W0 is placed at index 0, W3 is placed at index 3, W5 is placed at index 5, and W7 is placed at index 7 of decompressed weight tensor 250. The remaining weight values of decompressed weight tensor 250 are set to zero.

By way of comparison, assuming that the weight values are 32-bit floating-point numbers, storing the initial weight tensor 202 will take 256 bits. In contrast, storing the compressed weight tensor 226 together with compression header 220 will take 128 bits for the non-zero weight values, 8 bits for bit map 220, and 4 bits for the length value for a total of 140 bits. More generally, the compression ratio can be determined as:

$$CR=(NNZ*DS*8+m*n+\log_2(m*n))/(m*n*DS*8)$$

where NNZ is the number of non-zero elements, m is the number of columns in the original uncompressed weight tensor, n is the number of rows in the original uncompressed weight tensor, m×n is the total number of elements in the data, and DS is the element data size.

In some implementations, to further reduce the weight tensor size, the weight values can be quantized to reduce the number of bits required for each weight value. For example, 32-bit floating-point weight values can be quantized to 8-bit integers or 8-bit floating point numbers to reduce the size of each weight value by a factor of four. The quantization of weight values can be performed on initial weight tensor 202 or modified weight tensor 204 before compression, or can be performed on compressed weight tensor 226 after compression. In some instances, quantizing a weight value may round the weight value down to zero, and thus performing the quantization before compression may increase the sparsity of the weight tensor.

Figure 3A:
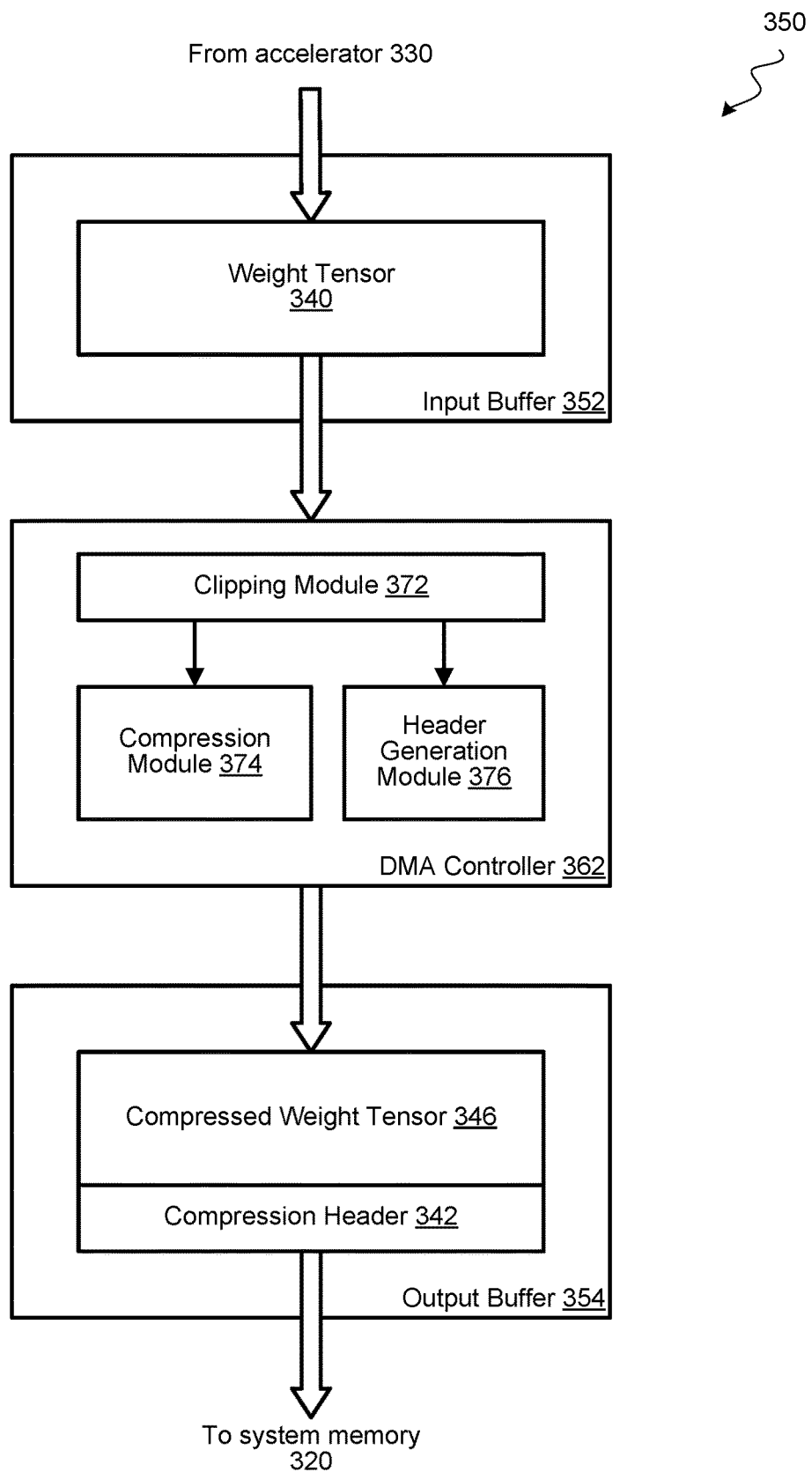
FIG. 3A illustrates a block diagram of an example of a direct memory access engine.

FIG. 3A illustrates a more detailed block diagram of an example of a portion of a DMA engine 350. DMA engine 350 can be, for example, DMA engine 150. DMA engine 350 includes an input buffer 352 configured to store a weight tensor read from accelerator 330, an output buffer 354 configured to write a compressed weight tensor to system memory 320, and a DMA controller 362 configured to compressed the weight tensor into the compressed weight tensor. During operation, DMA controller 362 can be configured to perform a compression operation on weight tensor 340, for example, when an operation type in the memory descriptor of the data transfer indicates that weight tensor 340 should be compressed before storing in system memory 330. The compression can be performed by DMA engine 350 in parallel while accelerator 330 is performing other computations. To facilitate compression of a weight tensor, DMA controller 362 may include a clipping module 372, a compression module 374, and a header generation module 376.

Clipping module 372 can be used to force some of the non-zero weight values of weight tensor 340 to zero if needed. Clipping module 372 may perform a sparsity analysis on weight tensor 340 (similar to sparsity analysis 262 as described with reference to FIG. 2) to determine if weight tensor 340 has sufficient zero values. If addition values should be forced to zero, clipping module 372 may force weight values having a magnitude being below a threshold to zero, or a certain number of weight values having the smallest magnitude to zero to generate a clipped weight tensor. Alternatively, or additionally, clipping module 372 can quantize weight tensor 340 to reduce the precision of the weight values and round some of the weight values down to zero.

Compression module 374 can be used to remove zero values from the clipped weight tensor generated by clipping module 372. For example, compression module 374 can compare each weight value to zero, and discard any weight values that are set to zero. Non-zero weight values can be written as a compressed weight tensor 346 to output buffer 364 in the same order as they appear in the clipped weight tensor generated by clipping module 372. To facilitate decompression of compressed weight tensor 346, header generation module 376 can generate a compression header 342 that includes a length of the weight tensor as well as an indicator as to which weight value of the clipped weight tensor has a non-zero value (or which weight value has a zero value). Compression header 342 can be written to output buffer 354 and be stored with compressed weight tensor 346 in system memory 330.

Figure 3B:
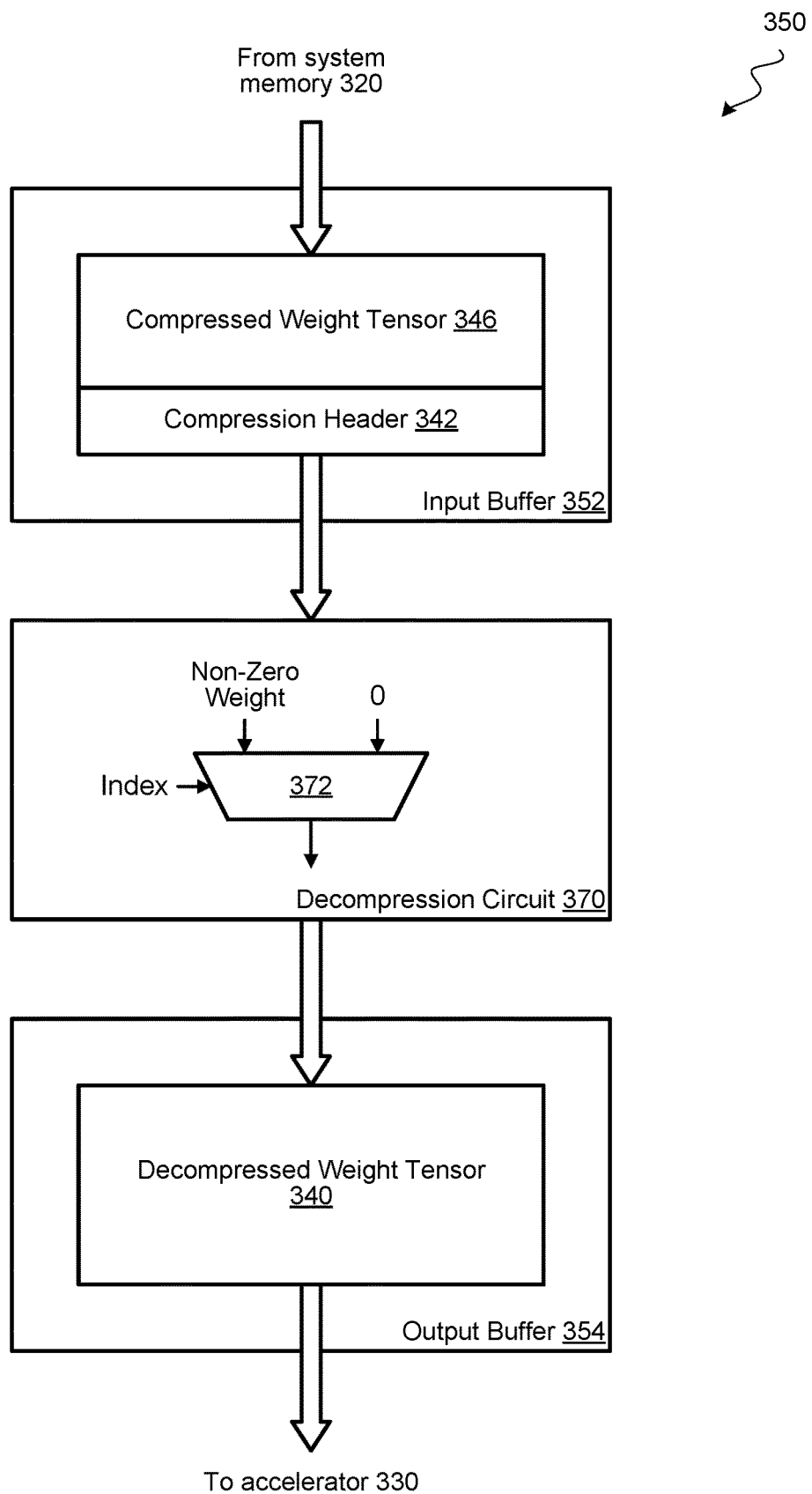
FIG. 3B illustrates a block diagram of another aspect of an example of a direct memory access engine.

FIG. 3B illustrates another aspect of the DMA engine 350 described above with reference to FIG. 3A. DMA engine 350 can be, for example, DMA engine 150. DMA engine 350 includes an input buffer 352 configured to store a data set read from system memory 320, an output buffer 354 configured to output data to an accelerator 330, and a decompression circuit block 370 that is coupled between input buffer 352 and output buffer 354 along the data transmission path of DMA engine 350. Decompression circuit block 370 is configured to determine that the data set stored in input buffer 352 includes data for a compressed weight tensor corresponding to a weight tensor for a neural network model, determine a size of the weight tensor, and decompress the compressed weight tensor by inserting zero weight values when transferring the set of weight values to output buffer 354.

During operation, input buffer 352 may read and store a data set from system memory 320 based on information (e.g., source address) in a memory descriptor. The data set may include a compression header 342 and a compressed weight tensor 346. In some implementations, the memory descriptor may include an operation type associated with the data set being read to indicate that the data being transferred includes compressed weight tensor 346. Decompression circuit block 370 may use this operation type in the memory descriptor to determine that the data set stored in input buffer 352 includes data from a compressed weight tensor, and a decompression operation is to be performed on that data. In some implementations, input buffer 352 may lack sufficient storage capacity to read and store the entire compressed weight tensor 346. As such, the compressed weight tensor 346 can be processed as a data stream, and compression header 342 can be read first to provide information used by decompression circuit 370 to perform on-the-fly decompression of the compressed weight tensor 346 as weight values are being read from system memory 320.

Compression header 342 may include a length value indicating the size of the weight tensor, and index information indicating locations in the weight tensor to insert the zero weight values. In some implementations, the length field can include row and column size information. The index information can be implemented as a binary bit map, and the binary bit map may contain the same number of bits as the number of elements or weight values in the weight tensor.

To facilitate expansion of the compressed weight tensor 346, decompression circuit block 370 may implement multiplexers 372 that are used to select between writing a non-zero weight value or a zero value to output buffer 354 for each weight value of the full length of the weight tensor. The index information (e.g., bit map) from the compression header can be used as the selection signal for multiplexers 372. Multiplexers 372 can operate on multiple bytes of the weight tensor at a time, and the number of bytes being operated on at a time may be limited only by the size of input buffer 352. AS decompression circuit block 370 provides the weight values of the decompressed weight tensor 340 to output buffer 354, output buffer 354 can begin writing the decompressed weight tensor 340 to accelerator 330. In some implementations, the decompressed weight tensor 340 may include quantized weight values and/or zero values that replaced original weight values having a magnitude being below a certain threshold.

DMA engine 350 can perform the decompression or expansion of the compressed set of weight values while accelerator 330 is performing a set of computations using a previous weight tensor. By offloading the decompression function to DMA engine 350, the latency between switching weight tensors can be reduced, and the overall throughput of the system can be increased. Compressing the weight tensor also reduces the amount of data to transfer from system memory, and hence reduces the number of read accesses to system memory 320, which speeds up the loading of weight tensor into accelerator 330.

Figure 4:
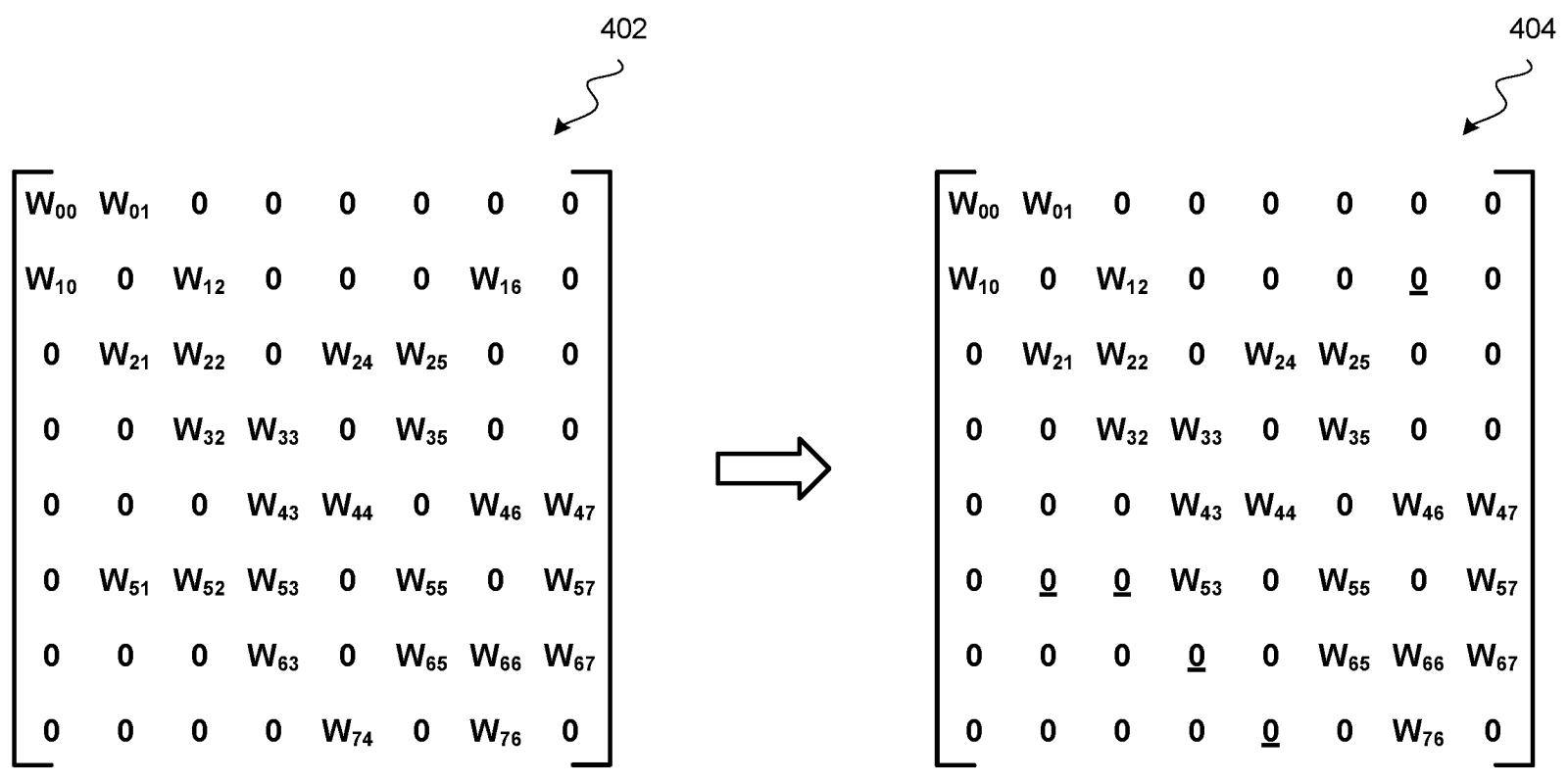
Figure 5:
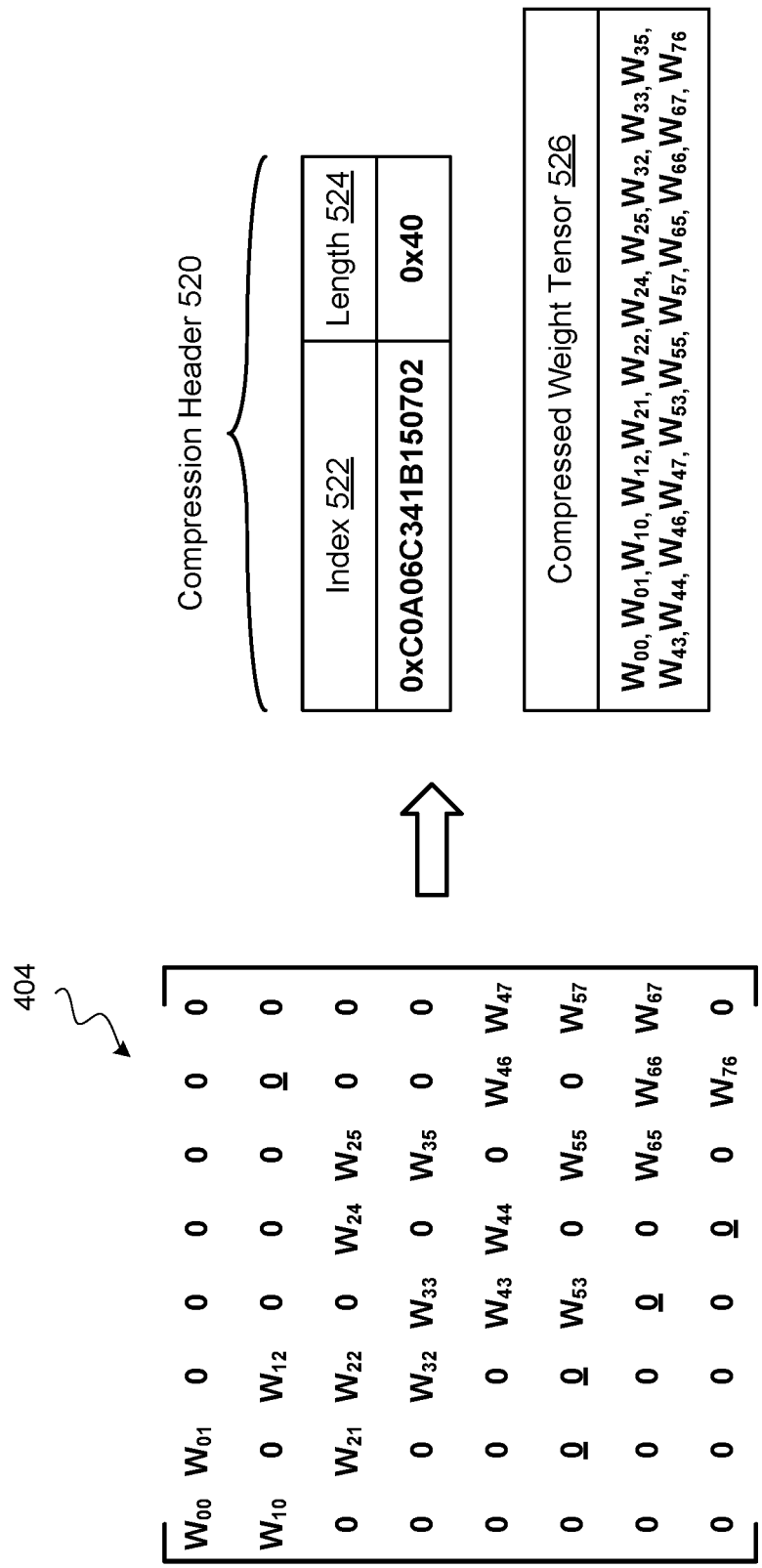
FIG. 5 illustrates an example of compressing a two-dimensional weight tensor.

To further illustrate the compression technique, FIG. 4 shows an example of a weight tensor represented as a two-dimensional matrix, and FIG. 5 shows an example of compressing the two-dimensional weight tensor. Referring to FIG. 4, an initial weight tensor 402 can be a 8×8 weight matrix containing 64 weight values. Initial weight tensor 402 is a sparse matrix including 37 zero values and 27 non-zero values. The sparsity of initial weight tensor 402 is hence 57.8%. The non-zero weight values are shown as $W_{rc}$ in which r is the row index and c is the column index of the weight value.

Although initial weight tensor 402 is already sparse and can be compressed as is, further size reduction can be achieved by performing a weight clipping operation. In the example shown in FIG. 4, initial weight tensor 402 is clipped to achieve a sparsity of 65%. Referring to modified weight tensor 404, the non-zero weight values $W_{16}$, $W_{51}$, $W_{52}$, $W_{63}$, and $W_{74}$ have been replaced with zero values. The zero values replacing these weight values are shown with an underline in modified weight tensor 404. The non-zero weight values being replaced can be values having a magnitude being below a certain threshold value, or can be the five smallest weight values in magnitude to replace to achieve the target 65% sparsity. The 65% target sparsity can be set, for example, based on a maximum storage size limit for the weight tensor.

Next, referring to FIG. 5, the modified weight tensor 404 is compressed to generate a compressed weight tensor 526 by removing all zero values from modified weight tensor 404. To facilitate decompression of compressed weight tensor 526, a compression header 520 is also generated. Compression header 520 may include index information 522 indicating the locations of non-zero weight values (or zero weight values), and a length value 524 indicating the length or number of weight values in the weight tensor. Length value 524 is 0x40 to indicate 64 elements or weight values in the weight tensor. Index information 522 can be a flattened bit map represent the locations of non-zero weight values. For example, the first byte of the index information 522 is 0xC0, which represents the position of non-zero weight values in the first row of weight tensor 404. The next byte 0xAO represents the position of non-zero weight values in the second row of weight tensor 404, and so on. Compression header 520 can be stored together with compressed weight tensor 526, for example, in system memory. A component such as a DMA engine reading compression header 520 with compressed weight tensor 526 can use compression header 520 to decompress or expand the compressed weight tensor 526 back to weight tensor 404 when weight tensor 404 is used for computations.

Figure 6:
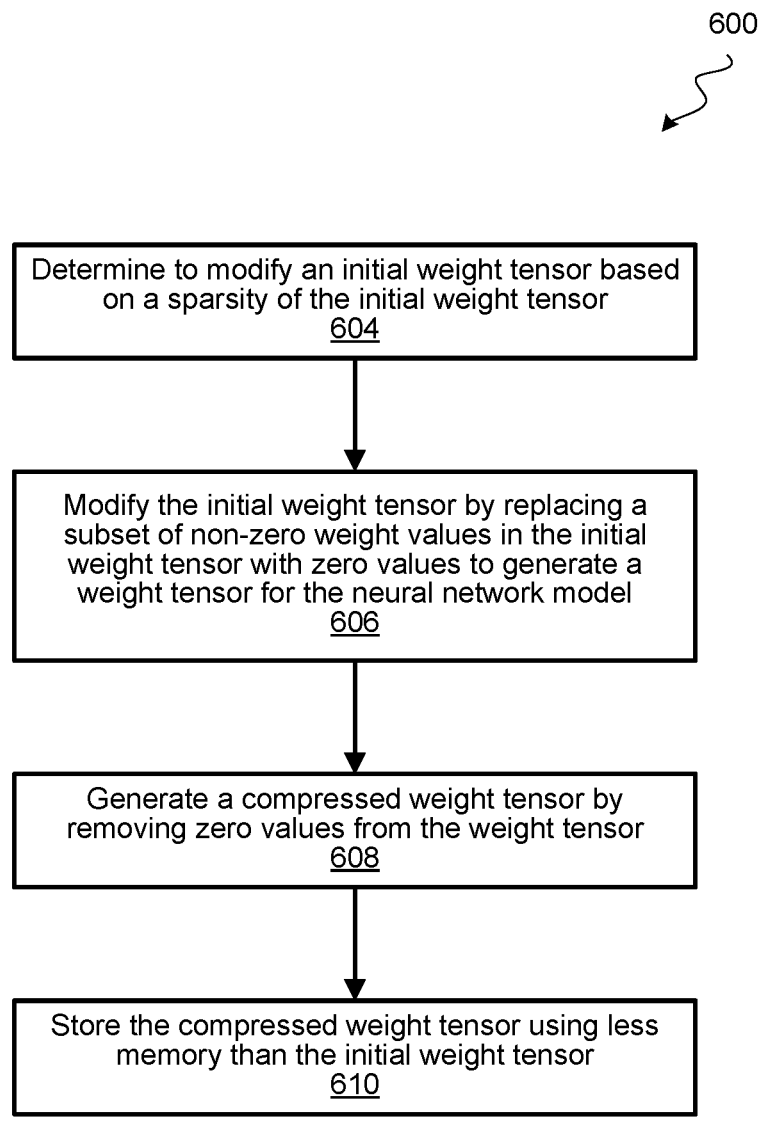
FIG. 6 illustrates a flow diagram of an example of a process to generate a compressed weight tensor.

FIG. 6 illustrates a flow diagram of a process 600 that can be used to generate a compressed weight tensor. Process 600 can be performed, for example, by computing system that is used for training a neural network model. In some implementations, the computing system may use one or more neural network accelerators to perform the training process. Process 600 can be implemented as code stored in a computer readable storage medium, or as other types of software implementation. Furthermore, process 600 may use compression techniques similar to those described with reference to FIG. 2.

Prior to executing process 600, a training operation can be performed on a neural network model to generate an initial weight tensor. The training operation can be one or more iterations of training in the middle of a training process, or can be a training operation that completes a training process to generate a weight tensor for inference operations. The training operation may include a forward pass to generate weight gradients, and a backward propagation pass that uses the weight gradients to update starting weight values to generate the initial weight tensor.

Process 600 may begin at block 604 in which a determination can be made to modify the initial weight tensor based on a sparsity of the initial weight tensor. For example, a determination can be made to modify the initial weight tensor if the initial weight tensor does not meet certain sparsity criteria (e.g., sparsity ratio, number of zero values), etc. In some implementations, a determination can be made to always modify the initial weight tensor.

At block 606, the initial weight tensor is modified by replacing a subset of non-zero weight values in the initial weight tensor with zero values to generate a weight tensor for the neural network model. The initial weight tensor can be modified by forcing a subset of the non-zero weight values to zero. For example, weight values having a magnitude being below a certain threshold can be forced to zero by comparing the magnitude of the non-zero weight value with a threshold value, determining that the magnitude of the non-zero weight value is below the threshold value, and replacing the non-zero weight value with a zero value. In some implementations, a number of the smallest weight values in magnitude can be forced or replaced with zero values. The weight values of the initial weight tensor can additionally or alternatively be quantized, and one or more non-zero weight values may round down to zero due to the quantization.

At block 608, a compressed weight tensor is generated by removing zero values from the weight tensor modified in block 606. The compressed weight tensor can have a significantly fewer number of weight values than the initial weight tensor, depending on the sparsity of the weight tensor being compressed. A compression header that includes information on locations of zero values in the weight tensor can also be generated prior to removal of the zero values. The compression header can also include size information pertaining to the size of the weight tensor.

Figure 7:
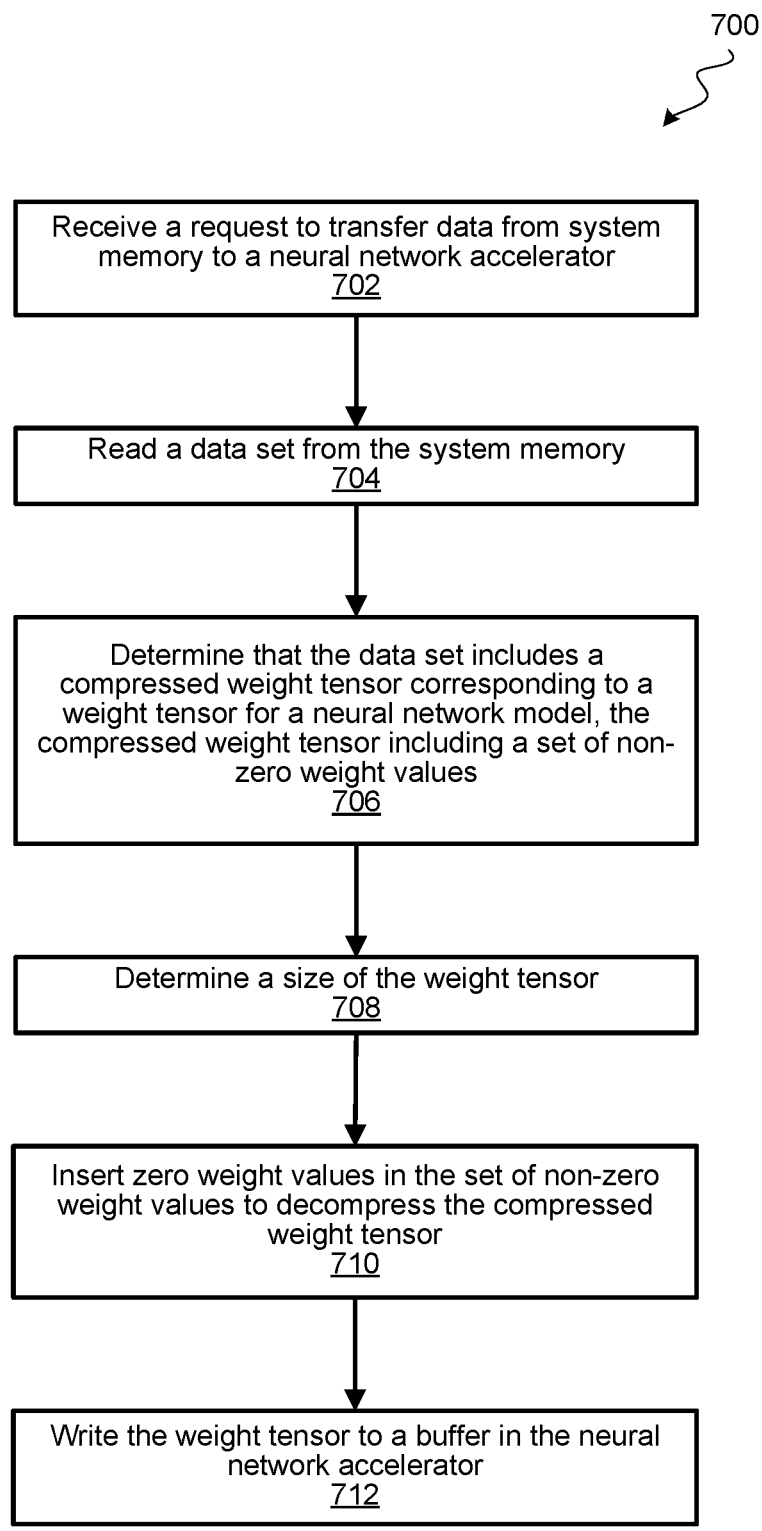
FIG. 7 illustrates a flow diagram of an example of a process to decompress a weight tensor.

At block 610, the compressed weight tensor is stored, for example, in system memory, using less memory than the initial weight tensor. In some implementations, compression information such as a compression header can be stored together with the compressed weight tensor FIG. 7 illustrates a flow diagram of a process 700 that can be used to decompress or expand a compressed weight tensor. Process 700 can be performed, for example, by a DMA engine in the process of retrieving a weight tensor from system memory for placement into an accelerator. This allows the accelerator to perform neural network computations using another weight tensor while the DMA engine is decompressing the compressed weight tensor. Process 700 may use decompression techniques similar to those described with reference to FIGS. 2 and 3.

Process 700 may begin at block 702 by receiving a request to transfer data from system memory to an accelerator (e.g., neural network accelerator). The request can be in the form of a memory descriptor that includes a source address, a destination address, a length of the data to transfer, and operation type indicating the data being transferred should be decompressed. For example, the source address may point to a location in system memory, and the destination address may point to a location in the accelerator. The memory descriptor can be placed in a descriptor queue, for example, by a data scheduler, for the DMA engine to process.

At block 704, a data set is read from the system memory as specified in the source address of the memory descriptor. The data set may include a compression header and a compressed weight tensor. The compression header may include index information indicating locations of the zero weight values (or non-zero values) in the weight tensor of the neural network model. The compression header may also include a length field indicating the size of the weight tensor. In some implementations, the length field may include a row size and column size if the weight tensor dimensions for loading into the accelerator can vary.

At block 706, a determination can be made that the data set read from system memory includes a compressed weight tensor of non-zero weight values corresponding to a weight tensor for a neural network model. The determination can be made, for example, by the operation type in the memory descriptor of the data transfer request. In some implementations, an operation type or a datatype indicating a compressed weight tensor can also be included in the compression header that is stored together with the compressed weight tensor.

At block 708, the size of the weight tensor is determined. The size of the weight tensor can be determined, for example, from the length field in the compression header. In some implementations, the size of the weight tensor can be used by the DMA engine to allocate the appropriate amount of space in the output buffer for the decompressed weight tensor.

At block 710, zero weight values are inserted into the set of non-zero weight values to decompress the compressed weight tensor. The zero weight values can be inserted according to the index information in the compression header. In some implementations, the index information can be used as the select signal for multiplexers to select between writing a zero value or a non-zero weight value to the output buffer of the DMA engine at the appropriate index of the weight tensor.

At block 712, the decompressed weight tensor is written to a target memory (e.g., a state buffer) in the accelerator. Upon receiving the decompressed weight tensor, the accelerator can load the weight tensor into a processing engine array and begin performing computations using the decompressed weight tensor. The computations can be part of a continuing training process, or can be for an inference operation.

Figure 8:
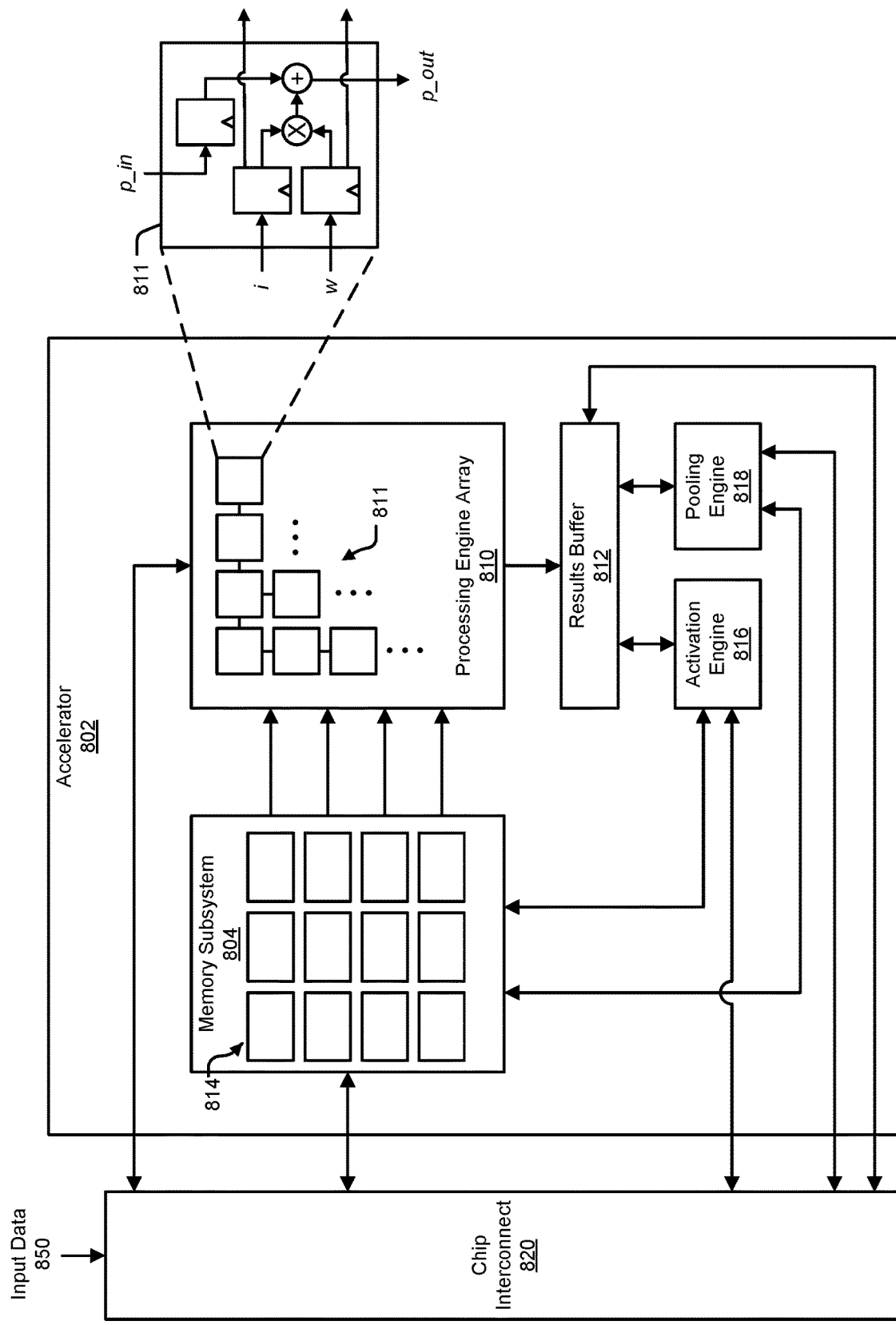
FIG. 8 illustrates a block diagram of an example of an accelerator.

FIG. 8 is a block diagram illustrating an example of an integrated circuit device that can include an accelerator 802. In various examples, the accelerator 802, for a set of input data (e.g., input data 850), can execute computations using a processing engine array 810, an activation engine 816, and/or a pooling engine 818. In some examples, the example accelerator 802 may be an integrated circuit component of a processor, such as a neural network processor. The processor may have other integrated circuit components, including additional accelerator engines.

In various implementations, the memory subsystem 804 can include multiple memory banks 814. In these implementations, each memory bank 814 can be independently accessible, meaning that the read of one memory bank is not dependent on the read of another memory bank. Similarly, writing to one memory bank does not affect or limit writing to a different memory bank. In some cases, each memory bank can be read and written at the same time. Various techniques can be used to have independently accessible memory banks 814. For example, each memory bank can be a physically separate memory component that has an address space that is separate and independent of the address spaces of each other memory bank. In this example, each memory bank may have at least one read channel and may have at least one separate write channel that can be used at the same time. In these examples, the memory subsystem 804 can permit simultaneous access to the read or write channels of multiple memory banks. As another example, the memory subsystem 804 can include arbitration logic such that arbitration between, for example, the outputs of multiple memory banks 814 can result in more than one memory bank's output being used. In these and other examples, though globally managed by the memory subsystem 804, each memory bank can be operated independently of any other.

Having the memory banks 814 be independently accessible can increase the efficiency of the accelerator 802. For example, values can be simultaneously read and provided to each row of the processing engine array 810, so that the entire processing engine array 810 can be in use in one clock cycle. As another example, the memory banks 814 can be read at the same time that results computed by the processing engine array 810 are written to the memory subsystem 804. In contrast, a single memory may be able to service only one read or write at a time. With a single memory, multiple clock cycles can be required, for example, to read input data for each row of the processing engine array 810 before the processing engine array 810 can be started.

In various implementations, the memory subsystem 804 can be configured to simultaneously service multiple clients, including the processing engine array 810, the activation engine 816, the pooling engine 818, and any external clients that access the memory subsystem 804 over a communication fabric 820. In some implementations, being able to service multiple clients can mean that the memory subsystem 804 has at least as many memory banks as there are clients. In some cases, each row of the processing engine array 810 can count as a separate client. In some cases, each column of the processing engine array 810 can output a result, such that each column can count as a separate write client. In some cases, output from the processing engine array 810 can be written into the memory banks 814 that can then subsequently provide input data for the processing engine array 810. As another example, the activation engine 816 and the pooling engine 818 can include multiple execution channels, each of which can be separate memory clients. The memory banks 814 can be implemented, for example, using static random access memory (SRAM).

In various implementations, the memory subsystem 804 can include control logic. The control logic can, for example, keep track of the address spaces of each of the memory banks 814, identify memory banks 814 to read from or write to, and/or move data between the memory banks 814. In some implementations, memory banks 814 can be hardwired to particular clients. For example, a set of memory banks 814 can be hardwired to provide values to the rows of the processing engine array 810, with one memory bank servicing each row. As another example, a set of memory banks can be hard wired to receive values from columns of the processing engine array 810, with one memory bank receiving data for each column.

The processing engine array 810 is the computation matrix of the example accelerator 802. The processing engine array 810 can, for example, execute parallel integration, convolution, correlation, and/or matrix multiplication, among other things. The processing engine array 810 includes multiple processing engines 811, arranged in rows and columns, such that results output by one processing engine 811 can be input directly into another processing engine 811. Processing engines 811 that are not on the outside edges of the processing engine array 810 thus can receive data to operate on from other processing engines 811, rather than from the memory subsystem 804.

In various examples, the processing engine array 810 uses systolic execution, in which data arrives at each processing engine 811 from different directions at regular intervals. In some examples, input data can flow into the processing engine array 810 from the left and weight values can be loaded at the top. In some examples weights and input data can flow from the left and partial sums can flow from top to bottom. In these and other examples, a multiply-and-accumulate operation moves through the processing engine array 810 as a diagonal wave front, with data moving to the right and down across the array. Control signals can be input at the left at the same time as weights, and can flow across and down along with the computation.

In various implementations, the number of columns in the processing engine array 810 determines the computational capacity of the processing engine array 810, and the number of rows determines the required memory bandwidth for achieving maximum utilization of the processing engine array 810. The processing engine array 810 can have, for example, 64 columns and 428 rows, or some other number of columns and rows.

An example of a processing engine 811 is illustrated in FIG. 8 in an inset diagram. As illustrated by this example, a processing engine 811 can include a multiplier-accumulator circuit. Inputs from the left can include, for example, input data i and a weight value w, where the input data is a value taken from either a set of input data or a set of intermediate results, and the weight value is from a set of weight values that connect one layer of the neural network to the next. A set of input data can be, for example, an image being submitted for identification or object recognition, an audio clip being provided for speech recognition, a string of text for natural language processing or machine translation, or the current state of a game requiring analysis to determine a next move, among other things. In some examples, the input data and the weight value are output to the right, for input to the next processing engine 811.

In the illustrated example, an input from above can include a partial sum, p_in, provided either from another processing engine 811 or from a previous round of computation by the processing engine array 810. When starting a computation for a new set of input data, the top row of the processing engine array 810 can receive a fixed value for p_in, such as zero. As illustrated by this example, i and w are multiplied together and the result is summed with p_in to produce a new partial sum, p_out, which can be input into another processing engine 811. Various other implementations of the processing engine 811 are possible.

Outputs from the last row in the processing engine array 810 can be temporarily stored in the results buffer 812. The results can be intermediate results, which can be written to the memory banks 814 to be provided to the processing engine array 810 for additional computation. Alternatively, the results can be final results, which, once written to the memory banks 814 can be read from the memory subsystem 804 over the communication fabric 820, to be output by the system.

In some implementations, the accelerator 802 includes an activation engine 816. In these implementations, the activation engine 816 can combine the results from the processing engine array 810 into one or more output activations. For example, for a convolutional neural network, convolutions from multiple channels can be summed to produce an output activation for a single channel. In other examples, accumulating results from one or more columns in the processing engine array 810 may be needed to produce an output activation for a single node in the neural network. In some examples, activation engine 816 can be bypassed.

In various examples, the activation engine 816 can include multiple separate execution channels. In these examples, the execution channels can correspond to the columns of the processing engine array 810, and can perform an operation on the outputs of a column, the result of which can be stored in the memory subsystem 804. In these examples, the activation engine 816 may be able to perform between 1 and n parallel computations, where n is equal to the number of columns in the processing engine array 810. In some cases, one or more of the computations can be performed simultaneously. Examples of computations that each execution channel can perform include exponentials, squares, square roots, identities, binary steps, bipolar steps, sigmoidals, and ramps, among other examples.

In some implementations, the accelerator 802 can include a pooling engine 818. Pooling is the combining of outputs of the columns of the processing engine array 810. Combining can include for example, computing a maximum value, a minimum value, an average value, a median value, a summation, a multiplication, or another logical or mathematical combination. In various examples, the pooling engine 818 can include multiple execution channels that can operating on values from corresponding columns of the processing engine array 810. In these examples, the pooling engine 818 may be able to perform between 1 and n parallel computations, where n is equal to the number of columns in the processing engine array 810. In various examples, execution channels of the pooling engine 818 can operate in parallel and/or simultaneously. In some examples, the pooling engine 818 can be bypassed.

Herein, the activation engine 816 and the pooling engine 818 may be referred to collectively as execution engines. The processing engine array 810 is another example of an execution engine. Another example of an execution engine is a Direct Memory Access (DMA) engine, which may be located outside the accelerator 802.

Input data 850 can arrive over the communication fabric 820. The communication fabric 820 can connect the accelerator 802 to other components of a processor, such as a DMA engine that can obtain input data 850 from an Input/Output (I/O) device, a storage drive, or a network interface. The input data 850 can be, for example one-dimensional data, such as a character string or numerical sequence, or two-dimensional data, such as an array of pixel values for an image or frequency and amplitude values over time for an audio signal. In some examples, the input data 850 can be three-dimensional, as may be the case with, for example, the situational information used by a self-driving car or virtual reality data. In some implementations, the memory subsystem 804 can include a separate buffer for the input data 850. In some implementations, the input data 850 can be stored in the memory banks 814 when the accelerator 802 receives the input data 850.

In some examples, the accelerator 802 can implement a neural network processing engine. In these examples, the accelerator 802, for a set of input data 850, can execute a neural network to perform a task for which the neural network was trained. Executing a neural network on a set of input data can be referred to as inference or performing inference.

The weights for the neural network can be stored in the memory subsystem 804, along with input data 850 on which the neural network will operate. The neural network can also include instructions, which can program the processing engine array 810 to perform various computations on the weights and the input data. The instructions can also be stored in the memory subsystem 804, in the memory banks 814 or in a separate instruction buffer. The processing engine array 810 can output intermediate results, which represent the outputs of individual layers of the neural network. In some cases, the activation engine 816 and/or pooling engine 818 may be enabled for computations called for by certain layers of the neural network. The accelerator 802 can store the intermediate results in the memory subsystem 804 for inputting into the processing engine array 810 to compute results for the next layer of the neural network. The processing engine array 810 can further output final results from a last layer of the neural network. The final results can be stored in the memory subsystem 804 and then be copied out to host processor memory or to another location.

Figure 9:
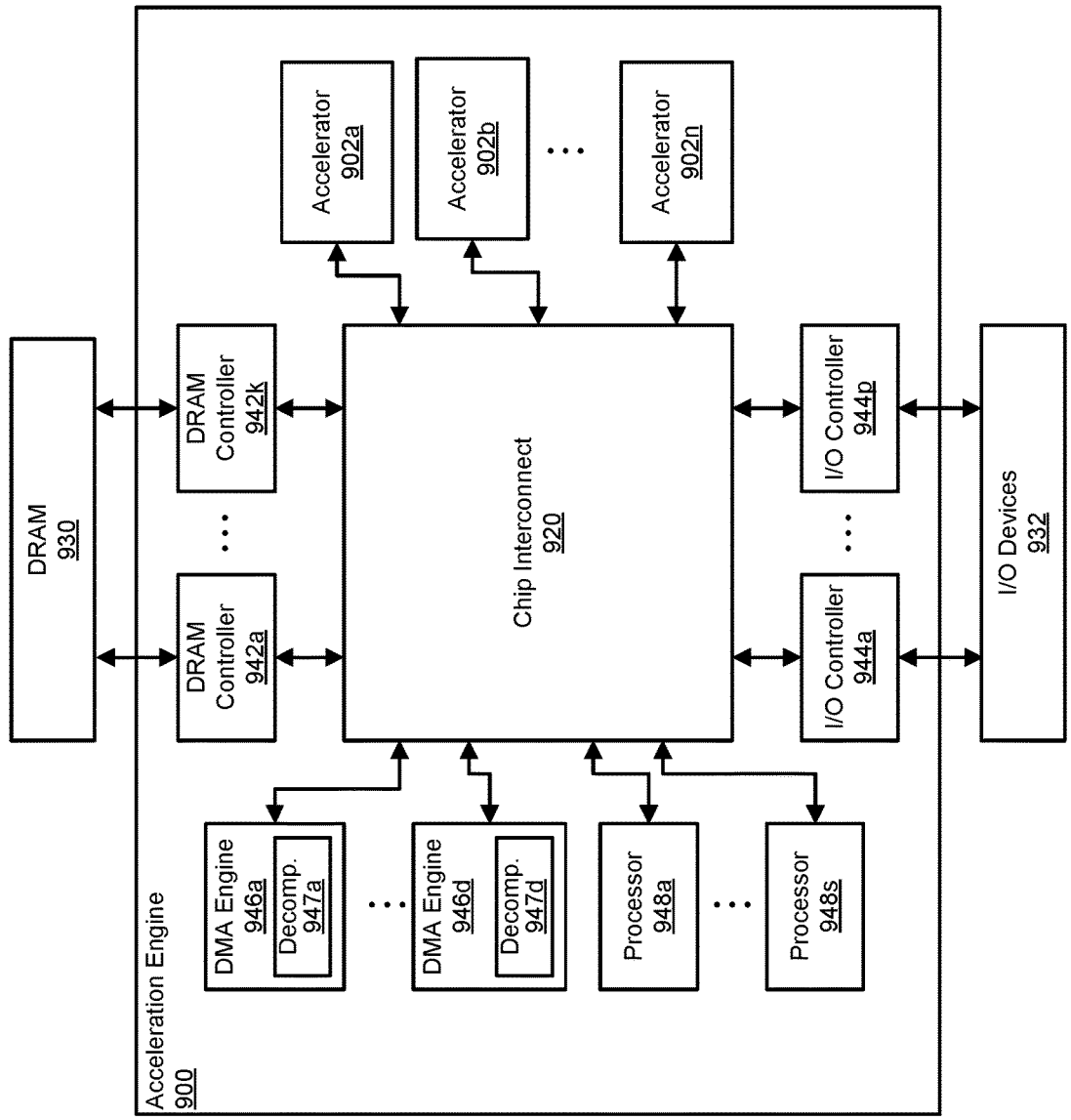
FIG. 9 illustrates a block diagram of an example of an acceleration engine.

FIG. 9 includes a block diagram that illustrates an example of an acceleration engine 900. The acceleration engine 900 is an example of an integrated circuit that can include one or more accelerators 902a-902n that may be similar to the accelerator illustrated in FIG. 8.

In the example of FIG. 9, the acceleration engine 900 includes multiple accelerators 902a-902n, each of which can perform a set of operations. In various examples, the accelerators 902a-902n are for particular types of operations, so that the accelerators 902a-902n can perform the operations much faster than when similar operations are performed by a general-purpose processor. In various examples, to perform a set of operations, input data on which the operations are to be performed must first be moved into the accelerators 902a-902n. Additionally, in some cases, program code is also moved into the accelerators 902a-902n, which programs the operations that the accelerators 902a-902n will perform on the data. In the illustrated example, the acceleration engine 900 includes n accelerators 902a-902n. Examples of accelerators that can be included in the acceleration engine 900 include graphics accelerators, floating point accelerators, neural network accelerators, and others. In various examples, the accelerators 902a-902n can each be the same (e.g., each of the is a graphics accelerator) or can be different (e.g., the accelerators 902a-902n include a graphics accelerator, a floating-point accelerator, and neural network accelerator).

The example acceleration engine 900 further includes DRAM controllers 942a-942k for communicating with an external memory. The external memory is implemented, in this example, using DRAM 930. In the illustrated example, the acceleration engine 900 includes k DRAM controllers 942a-942k, each of which may be able to communicate with an independent set of banks of DRAM. In other examples, other types of RAM technology can be used for the external memory. The DRAM controllers 942a-942k can also be referred to as memory controllers.

In various examples, input data and/or program code for the accelerators 902a-902n can be stored in the DRAM 930. Different programs can cause the accelerators 902a-902n to perform different operations. For example, when one of the accelerators is a neural network accelerator, one program can configure the neural network accelerator to perform speech recognition while another program can configure the neural network accelerator to perform image recognition. In various examples, different accelerators 902a-902n can be programmed with different programs, so that each performs a different set of operations. In various examples, the processors 948a-948s can manage moving of program code from the DRAM 930 to the accelerators 902a-902n.

The example acceleration engine 900 further includes I/O controllers 944a-944p for communicating with I/O devices 932 in the system. The acceleration engine 900 can communicate with I/O devices over, for example, a processor bus. In some examples, the processor bus can be implemented using Peripheral Component Interconnect (PCI) and/or a variation of the PCI bus protocol. The processor bus can connect the acceleration engine 900 to I/O devices such as, for example, input and output devices, memory controllers, storage devices, and/or network interface cards, among other things. In some examples, the I/O controllers 944-944p can enable the acceleration engine 900 to act as an I/O device for a host processor. For example, the acceleration engine 900 can be the recipient of input data from the host processor, and a command indicating an operation to be performed on the input data (e.g., a particular computation or analysis). In the illustrated example, the acceleration engine 900 includes p I/O controllers 944a-944p, each of which may include a separate root complex and may communicate with a separate set of I/O devices 932. In other examples, other standardized bus protocols, such as Ultra Path Interconnect (UPI) can be used for the host bus. In other examples, a proprietary bus protocol can be used.

Movement of data in the acceleration engine 900 can be managed by one or more processors 948a-948s, which can also be referred to as data management processors. In the example of FIG. 9, the acceleration engine 900 includes s processors 948a-948s incorporated into the device (e.g., on the same silicon die). In other examples, the processors 948a-948s can be external to the acceleration engine 900 (e.g., on a different die and/or in a different package). In some examples, the processors 948a-948s can manage the movement of data from I/O devices 932 to the accelerators 902a-902n or the DRAM 930. For example, input data may be located at an I/O device 932 or in processor memory, and the processors 948a-948s can move the input from the I/O device 932 or processor memory into an accelerator or into DRAM 930. As another example, program code for the accelerators 902a-902n may be located on an I/O device 932 or in processor memory.

The example acceleration engine 900 further includes DMA engines 946a-946d that can move data between the accelerators 902a-902n, DRAM controllers 942a-942k, and I/O controllers 944a-944p. DMA engines 946a-946d can be similar to the DMA engine shown in FIGS. 1 and 3, and each may include respective decompression circuit blocks 947a-947d. In the illustrated example, the acceleration engine 900 includes d DMA engines 946a-946d. In some implementations, the DMA engines 946a-946d can be assigned to specific tasks, such as moving data from the DRAM controllers 942a-942d to the accelerators 902a-902n, or moving data between the I/O controllers 944a-944p and the accelerators 902a-902n. These tasks can be assigned, for example, by enqueueing descriptors with the DMA engines 946a-946d, where a descriptor identifies an address for a block of data and an operation (e.g., a read or a write) to perform. A descriptor, for example, can direct a DMA engine to instruct a DMA controller to read a block of data from DRAM 930. A descriptor can, as a further example, instruct the DMA engine to write data, read by the DMA controller, to an accelerator. Further descriptors can be used to move data from an accelerator to DRAM 930.

In various examples, each of the processors 948a-948s can be responsible for managing the data movement for a different accelerator. In some examples, a processor may manage the data movement for more than one accelerator. Similarly, in various examples, each of the processors 948a-948s can be assigned to one or more DMA engines 946a-946d. In these and other examples, associations between processors 948a-948s, accelerators 902a-902n, and DMA engines 946a-946d are determined by program code being executed by each respective processor.

In the example acceleration engine 900, the various components can communicate over a chip interconnect 920. The chip interconnect 920 primarily includes wiring for routing data between the components of the acceleration engine 900. In some cases, the chip interconnect 920 can include a minimal amount of logic, such as multiplexors to control the direction of data, flip-flops for handling clock domain crossings, and timing logic.

Figure 10:
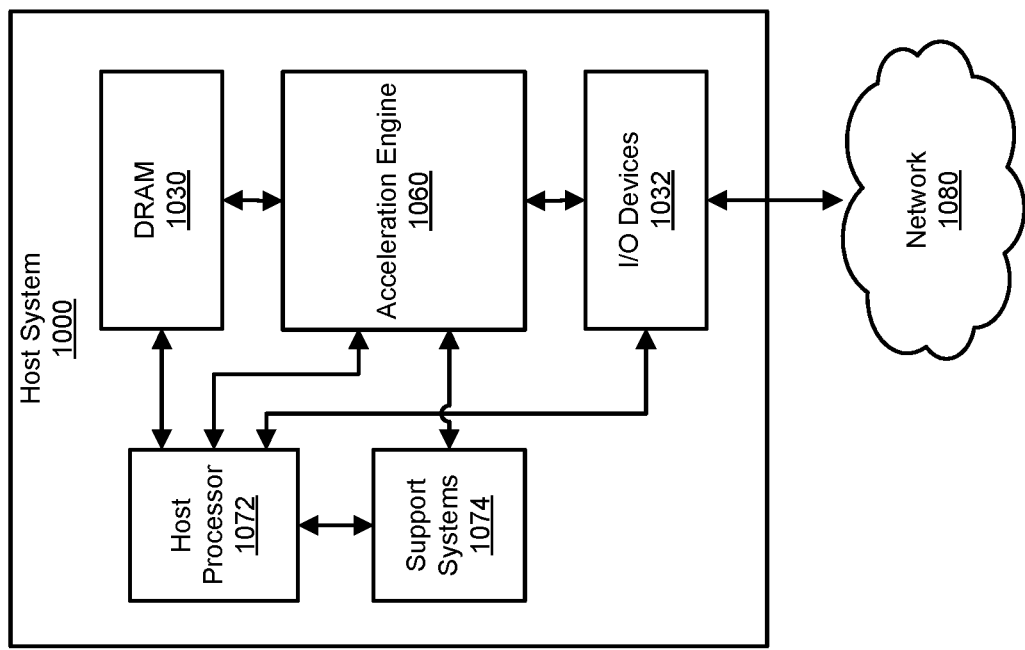
FIG. 10 illustrates a block diagram of an example of a host system.

FIG. 10 includes a block diagram that illustrates an example of a host system 1000 in which an acceleration engine 1060 can be used. The acceleration engine 1060 of FIG. 10 is an example of a device that can include one or more accelerators such as is illustrated in FIG. 9. The example host system 1000 of FIG. 10 includes the acceleration engine 1060, a host processor 1072, DRAM 1030 or processor memory, I/O devices 1032, and support systems 1074. In various implementations, the host system 1000 can include other hardware that is not illustrated here.

The host processor 1072 is a general-purpose integrated circuit that is capable of executing program instructions. In some examples, the host processor 1072 can include multiple processing cores. A multi-core processor may include multiple processing units within the same processor. In some examples, the host system 1000 can include more than one host processor 1072. In some examples, the host processor 1072 and the acceleration engine 1060 can be one chip, such as, one or more integrated circuits within the same package.

In various examples, the host processor 1072 can communicate with other components in the host system 1000 over one or more communication channels. For example, the host system 1000 can include a host processor bus, which the host processor 1072 can use to communicate with the DRAM 1030, for example. As another example, the host system 1000 can include an I/O bus, such as a PCI-based bus, over which the host processor 1072 can communicate with the acceleration engine 1060 and/or the I/O devices 1032, for example. In various examples, the host system 1000 can, alternatively or additionally, include other communication channels or busses, such as serial busses, power management busses, storage device busses, and so on.

In some examples, software programs executing on the host processor 1072 can receive or generate input for processing by the acceleration engine 1060. In some examples, the programs can select an appropriate neural network to execute for a given input. For example, a program may be for language translation, and can select one or more neural networks capable of speech recognition and/or machine translation. In these and other examples, the programs can configure the acceleration engine 1060 with the neural network to execute, and/or can select a neural network processing engine on the acceleration engine 1060 that has previously been configured to execute the desired neural network. In some examples, once the acceleration engine 1060 has started an inference on input data, the host processor 1072 can manage the movement of data (such as weights, instructions, intermediate results, results of conditional layers, and/or final results) into or out of the acceleration engine 1060.

In some examples, a software program that is using the acceleration engine 1060 to conduct an inference can read the result from a conditional layer from the acceleration engine 1060 and/or from a storage location, such as in DRAM 1030. In these examples, the program can determine what action the neural network should take next. For example, the program can determine to terminate the inference. As another example, the program can determine to change the direction of the inference, which can be translated by lower level code and/or the neural network processor to a next layer to execute. In these and other examples, the execution flow of the neural network can be coordinated by software.

The DRAM 1030 is memory that is used by the host processor 1072 for storage of program code that the host processor 1072 is in the process of executing, as well as values that are being operated on. In some examples, the data for a neural network (e.g., weight values, instructions, and other data) can be all or partially stored in the DRAM 1030. DRAM is a common term for processor memory, and though DRAM is volatile memory, processor memory can be volatile and/or non-volatile. Though not illustrated here, the host system 1000 can include other volatile and non-volatile memories for other purposes. For example, the host system 1000 can include a Read-Only Memory (ROM) that stores boot code for booting the host system 1000 at power on, and/or Basic Input/Output System (BIOS) code.

Though not illustrated here, the DRAM 1030 can store instructions for various programs, which can be loaded into and be executed by the host processor 1072. For example, the DRAM 1030 can be storing instructions for an operating system, one or more data stores, one or more application programs, one or more drivers, and/or services for implementing the features disclosed herein.

The operating system can manage and orchestrate the overall operation of the host system 1000, such as scheduling tasks, executing applications, and/or controller peripheral devices, among other operations. In some examples, a host system 1000 may host one or more virtual machines. In these examples, each virtual machine may be configured to execute its own operating system. Examples of operating systems include Unix, Linux, Windows, Mac OS, iOS, Android, and the like. The operating system may, alternatively or additionally, be a proprietary operating system.

The data stores can include permanent or transitory data used and/or operated on by the operating system, application programs, or drivers. Examples of such data include web pages, video data, audio data, images, user data, and so on. The information in the data stores may, in some examples, be provided over the network(s) to user devices. In some cases, the data stores may additionally or alternatively include stored application programs and/or drivers. Alternatively or additionally, the data stores may store standard and/or proprietary software libraries, and/or standard and/or proprietary application user interface (API) libraries. Information stored in the data stores may be machine-readable object code, source code, interpreted code, or intermediate code.

The drivers can include programs that provide communication between components in the host system 1000. For example, some drivers can provide communication between the operating system and peripheral devices or I/O devices 1032. Alternatively or additionally, some drivers may provide communication between application programs and the operating system, and/or application programs and peripheral devices accessible to the host system 1000. In many cases, the drivers can include drivers that provide well-understood functionality (e.g., printer drivers, display drivers, hard disk drivers, Solid State Device drivers, etc.). In other cases, the drivers may provide proprietary or specialized functionality.

The I/O devices 1032 can include hardware for connecting to user input and output devices, such as keyboards, mice, pens, tablets, voice input devices, touch input devices, displays or monitors, speakers, and printers, among other devices. The I/O devices 1032 can also include storage drives and/or network interfaces for connecting to a network 1080. For example, the host system 1000 can use a network interface to communicate with storage devices, user terminals, other computing devices or servers, and/or other networks, among various examples.

In various examples, one or more of the I/O devices 1032 can be storage devices. In these examples, the storage devices include non-volatile memory and can store program instructions and/or data. Examples of storage devices include magnetic storage, optical disks, solid state disks, flash memory, and/or tape storage, among others. The storage device can be housed in the same chassis as the host system 1000 or may be in an external enclosure. A storage device can be fixed (e.g., attached by screws) or removable (e.g., having a physical release mechanism and possibly a hot-plug mechanism).

Storage devices, the DRAM 1030, and any other memory component in the host system 1000 are examples of computer-readable storage media. Computer-readable storage media are physical mediums that are capable of storing data in a format that can be read by a device such as the host processor 1072. Computer-readable storage media can be non-transitory. Non-transitory computer-readable media can retain the data stored thereon when no power is applied to the media. Examples of non-transitory computer-readable media include ROM devices, magnetic disks, magnetic tape, optical disks, flash devices, and solid-state drives, among others. As used herein, computer-readable storage media does not include computer-readable communication media.

In various examples, the data stored on computer-readable storage media can include program instructions, data structures, program modules, libraries, other software program components, and/or other data that can be transmitted within a data signal, such as a carrier wave or other transmission. The computer-readable storage media can, additionally or alternatively, include documents, images, video, audio, and other data that can be operated on or manipulated through the use of a software program.

In various examples, one or more of the I/O devices 1032 can be PCI-based devices. In these examples, a PCI-based I/O device includes a PCI interface for communicating with the host system 1000. The term "PCI" or "PCI-based" may be used to describe any protocol in the PCI family of bus protocols, including the original PCI standard, PCI-X, Accelerated Graphics Port (AGP), and PCI-Express(PCIe) or any other improvement or derived protocols that are based on the PCI protocols discussed herein. The PCI-based protocols are standard bus protocols for connecting devices, such as a local peripheral device, to a host device. A standard bus protocol is a data transfer protocol for which a specification has been defined and adopted by various manufacturers. Manufacturers ensure that compliant devices are compatible with computing systems implementing the bus protocol, and vice versa. As used herein, PCI-based devices also include devices that communicate using Non-Volatile Memory Express (NVMe). NVMe is a device interface specification for accessing non-volatile storage media attached to a computing system using PCIe.

A PCI-based device can include one or more functions. A "function" describes the hardware and/or software of an operation that may be provided by the PCI-based device. Examples of functions include mass storage controllers, network controllers, display controllers, memory controllers, serial bus controllers, wireless controllers, and encryption and decryption controllers, among others. In some cases, a PCI-based device may include more than one function. For example, a PCI-based device may provide a mass storage controller and a network adapter. As another example, a PCI-based device may provide two storage controllers, to control two different storage resources. In some implementations, a PCI-based device may have up to eight functions.

In some examples, the PCI-based device can include single-root I/O virtualization (SR-IOV). SR-IOV is an extended capability that may be included in a PCI-based device. SR-IOV allows a physical resource (e.g., a single network interface controller) to appear as multiple virtual resources (e.g., sixty-four network interface controllers). Thus, a PCI-based device providing a certain functionality (e.g., a network interface controller) may appear to a device making use of the PCI-based device to be multiple devices providing the same functionality. The functions of an SR-IOV-capable storage adapter device may be classified as physical functions (PFs) or virtual functions (VFs). Physical functions are fully featured functions of the device that can be discovered, managed, and manipulated. Physical functions have configuration resources that can be used to configure or control the storage adapter device. Physical functions include the same configuration address space and memory address space that a non-virtualized device would have. A physical function may have a number of virtual functions associated with it. Virtual functions are similar to physical functions, but are light-weight functions that may generally lack configuration resources, and are generally controlled by the configuration of their underlying physical functions. Each of the physical functions and/or virtual functions may be assigned to a respective thread of execution (such as for example, a virtual machine) running on a host device.

In various implementations, the support systems 1074 can include hardware for coordinating the operations of the acceleration engine 1060. For example, the support systems 1074 can include a microprocessor that coordinates the activities of the acceleration engine 1060, including moving data around on the acceleration engine 1060. In this example, the microprocessor can be an integrated circuit that can execute microcode. Microcode is program code that can enable an integrated circuit to have some flexibility in the operations that the integrated circuit can execute, but because the program code uses a limited instruction set, the microprocessor may have more limited capability than the host processor 1072. In some examples, the program executed by the microprocessor is stored on the hardware of microprocessor, or on a non-volatile memory chip in the host system 1000. In some examples, the microprocessor and the acceleration engine 1060 can be on chip, such as one integrated circuit on the same die and in the same package.

In some examples, the support systems 1074 can be responsible for taking instructions from the host processor 1072 when programs executing on the host processor 1072 request the execution of a neural network. For example, the host processor 1072 can provide the support systems 1074 with a set of input data and a task that is to be performed on the set of input data. In this example, the support systems 1074 can identify a neural network that can perform the task, and can program the acceleration engine 1060 to execute the neural network on the set of input data. In some examples, the support systems 1074 only needs to select an appropriate neural network processing engine of the neural network processor. In some examples, the support systems 1074 may need to load the data for the neural network onto the acceleration engine 1060 before the acceleration engine 1060 can start executing the neural network. In these and other examples, the support systems 1074 can further receive the output of executing the neural network, and provide the output back to the host processor 1072.

In some examples, the operations of the support systems 1074 can be handled by the host processor 1072. In these examples, the support systems 1074 may not be needed and can be omitted from the host system 1000.

In various examples, the host system 1000 can include a combination of host systems, processor nodes, storage subsystems, and I/O chassis that represent user devices, service provider computers or third-party computers.

User devices can include computing devices to access an application (e.g., a web browser or mobile device application). In some examples, the application may be hosted, managed, and/or provided by a computing resources service or service provider. The application may enable a user to interact with the service provider computer to, for example, access web content (e.g., web pages, music, video, etc.). The user device may be a computing device such as, for example, a mobile phone, a smart phone, a personal digital assistant (PDA), a laptop computer, a netbook computer, a desktop computer, a thin-client device, a tablet computer, an electronic book (e-book) reader, a gaming console, etc. In some examples, the user device may be in communication with the service provider computer over one or more networks. Additionally, the user device may be part of the distributed system managed by, controlled by, or otherwise part of the service provider computer (e.g., a console device integrated with the service provider computers).

The host system 1000 can also represent one or more service provider computers. A service provider computer may provide a native application that is configured to run on user devices, which users may interact with. The service provider computer may, in some examples, provide computing resources such as, but not limited to, client entities, low latency data storage, durable data storage, data access, management, virtualization, cloud-based software solutions, electronic content performance management, and so on. The service provider computer may also be operable to provide web hosting, databasing, computer application development and/or implementation platforms, combinations of the foregoing or the like. In some examples, the service provider computer may be provided as one or more virtual machines implemented in a hosted computing environment. The hosted computing environment can include one or more rapidly provisioned and released computing resources. These computing resources can include computing, networking and/or storage devices. A hosted computing environment may also be referred to as a cloud computing environment. The service provider computer may include one or more servers, perhaps arranged in a cluster, as a server farm, or as individual servers not associated with one another, and may host application and/or cloud-based software services. These servers may be configured as part of an integrated, distributed computing environment. In some examples, the service provider computer may, additionally or alternatively, include computing devices such as for example a mobile phone, a smart phone, a personal digital assistant (PDA), a laptop computer, a desktop computer, a netbook computer, a server computer, a thin-client device, a tablet computer, a gaming console, etc. In some instances, the service provider computer may communicate with one or more third party computers.

The modules described herein may be software modules, hardware modules or a suitable combination thereof. If the modules are software modules, the modules can be embodied on a non-transitory computer readable medium and processed by a processor in any of the computer systems described herein. It should be noted that the described processes and architectures can be performed either in real-time or in an asynchronous mode prior to any user interaction. The modules may be configured in the manner suggested in the preceding figures, and/or functions described herein can be provided by one or more modules that exist as separate modules and/or module functions described herein can be spread over multiple modules.

The specification and drawings are, accordingly, to be regarded in an illustrative rather than a restrictive sense. It will, however, be evident that various modifications and changes may be made thereunto without departing from the broader spirit and scope of the disclosure as set forth in the claims.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions, and equivalents falling within the spirit and scope of the disclosure, as defined in the appended claims.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. Recitation of ranges of values herein are merely intended to serve as a shorthand method of referring individually to each separate value falling within the range, unless otherwise indicated herein and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

Disjunctive language such as the phrase "at least one of X, Y, or Z," unless specifically stated otherwise, is intended to be understood within the context as used in general to present that an item, term, etc., may be either X, Y, or Z, or any combination thereof (e.g., X, Y, and/or Z). Thus, such disjunctive language is not generally intended to, and should not, imply that certain examples require at least one of X, at least one of Y, or at least one of Z to each be present.

Various examples of this disclosure are described herein, including the best mode known to the inventors for carrying out the disclosure. Variations of those examples may become apparent to those of ordinary skill in the art upon reading the foregoing description. The inventors expect skilled artisans to employ such variations as appropriate and the inventors intend for the disclosure to be practiced otherwise than as specifically described herein. Accordingly, this disclosure includes all modifications and equivalents of the subject matter recited in the claims appended hereto as permitted by applicable law. Moreover, any combination of the above-described elements in all possible variations thereof is encompassed by the disclosure unless otherwise indicated herein or otherwise clearly contradicted by context.

What is claimed is:

1. A computer-implemented method comprising:
  performing a training operation on a neural network model to generate a first weight tensor;
  compressing, by a direct memory access (DMA) engine, the first weight tensor to meet a first sparsity criteria by:
    replacing a subset of non-zero weight values in the first weight tensor with zero values to generate a clipped weight tensor having a first sparsity corresponding to the first sparsity criteria for the neural network model; and
    generating a first compressed weight tensor by removing zero values from the clipped weight tensor;
  performing a subsequent stage of the training operation using the first compressed weight tensor to generate a second weight tensor;
  compressing, by the DMA engine, the second weight tensor into a second compressed weight tensor having a second sparsity corresponding to a second sparsity criteria, the second sparsity having a higher density than the first sparsity;
  storing the second compressed weight tensor with the compression header having information on locations of zero values in the second weight tensor in system memory;
  retrieving the second compressed weight tensor with the compression header from the system memory by the DMA engine according to a memory descriptor placed in a descriptor queue to transfer a data set, the memory descriptor containing an address and an operation type that indicates the data set includes compressed data;
  in response to the operation type of the memory descriptor indicating the data set includes compressed data, using the compression header to decompress the second compressed weight tensor into a regenerated weight tensor in the DMA engine;
  loading the regenerated weight tensor into a systolic array of a neural network accelerator using the DMA engine; and performing neural network computations in the systolic array of the neural network accelerator using the regenerated weight tensor for further training or inference,
wherein the systolic array of the neural network accelerator is performing other neural network computations including matrix multiplication operations while the DMA engine is performing compression and decompression operations.

2. The computer-implemented method of claim 1, wherein replacing the subset of non-zero weight values in the first weight tensor includes:
comparing a non-zero weight value with a threshold value;
determining that a magnitude of the non-zero weight value is below the threshold value; and
replacing the non-zero weight value with a zero value.

3. The computer-implemented method of claim 1, further comprising quantizing weight values to generate the first weight tensor.

4. A direct memory access (DMA) engine comprising:
a DMA controller configured to perform weight tensor compression operations according to a sparsity criteria during a training process, wherein the sparsity criteria is adjusted as training progresses;
a descriptor queue configured to store memory descriptors for the DMA engine to process, each memory descriptor providing an address and an operation type for a data transfer;
an input buffer configured to store a data set read from system memory according to a memory descriptor retrieved from the descriptor queue;
an output buffer configured to output a weight tensor to a neural network accelerator; and
a decompression circuit block coupled between the input buffer and the output buffer, wherein the decompression circuit block is configured to:
determine, based on the operation type of the memory descriptor retrieved from the descriptor queue, that the data set stored in the input buffer includes a compressed weight tensor corresponding to the weight tensor for a neural network model, wherein the compressed weight tensor contains a set of non-zero weight values;
determine a size of the weight tensor;
decompress the compressed weight tensor by inserting zero weight values into the set of non-zero weight values; and
provide the weight tensor to the output buffer,
wherein a systolic array of the neural network accelerator is configured to perform other neural network computations including matrix multiplication operations while the DMA engine is performing compression and decompression operations.

5. The direct memory access engine of claim 4, wherein the data set includes a compression header that is used by the decompression circuit block to decompress the compressed weight tensor.

6. The direct memory access engine of claim 5, wherein the compression header includes index information indicating locations in the weight tensor to insert the zero weight values.

7. The direct memory access engine of claim 6, wherein the index information is implemented as a binary bit map containing a number of bits being equal to a number of elements in the weight tensor.

8. The direct memory access engine of claim 5, wherein the compression header includes a length value indicating a size of the weight tensor.

9. The direct memory access engine of claim 4, wherein the DMA controller is configured to adjust the sparsity criteria to increase sparsity as training progresses.

10. The direct memory access engine of claim 4, wherein the weight values in the weight tensor are quantized weight values.

11. The direct memory access engine of claim 4, wherein the weight tensor includes zero values that replaced non-zero values having a magnitude that is below a threshold value.

12. The direct memory access engine of claim 4, wherein the sparsity criteria is expressed as a maximum number of non-zero values allowed for the weight tensor.

13. A method comprising:
performing, by a direct memory access (DMA) engine, weight tensor compression operations according to a sparsity criteria during a training process of a neural network model, wherein the sparsity criteria is adjusted to increase sparsity as training progresses;
storing, in system memory, a compressed weight tensor corresponding to a weight tensor generated by the training process;
receiving, by the DMA engine, a memory descriptor placed in a descriptor queue to transfer data from the system memory to a neural network accelerator, wherein the memory descriptor contains an address and an operation type that indicates the data set includes the compressed weight tensor;
reading, by the DMA engine, a data set from the system memory;
determining, by the DMA engine based on the operation type of the memory descriptor, that the data set includes the compressed weight tensor corresponding to the weight tensor for the neural network model, the compressed weight tensor including a set of non-zero weight values;
determining, by the DMA engine, a size of the weight tensor;
inserting, by the DMA engine, zero weight values in the set of non-zero weight values to decompress the compressed weight tensor; and
writing, by the DMA engine, the weight tensor to a buffer in the neural network accelerator,
wherein the weight tensor compression operations and the decompression of the compressed weight tensor are performed by the DMA engine while a systolic array of the neural network accelerator is performing other neural network computations including matrix multiplication operations.

14. The method of claim 13, wherein the data set includes a compression header containing index information indicating locations of the zero weight values in the weight tensor.

15. The method of claim 14, wherein the compression header includes a length field indicating the size of the weight tensor.

16. The method of claim 13, wherein the compressed weight tensor is compressed by replacing a subset of non-zero weight values in the weight tensor with zero values.

17. The method of claim 16, wherein the number of non-zero weight values in the weight tensor being replaced by zero values is a predetermined number of lowest magnitude non-zero weight values.

18. The method of claim 16, wherein the non-zero weight values being replaced by zero values include all non-zero weight values in the weight tensor having a magnitude that is below a threshold value.

19. The method of claim 18, further comprising adjusting the threshold value to meet the sparsity criteria of the weight tensor.

* * * * *